(12) United States Patent
Morita et al.

(10) Patent No.: US 6,342,716 B1
(45) Date of Patent: *Jan. 29, 2002

(54) SEMICONDUCTOR DEVICE HAVING DOT ELEMENTS AS FLOATING GATE

(75) Inventors: Kiyoyuki Morita, Kyoto; Kiyoshi Morimoto, Osaka; Kiyoshi Araki, Osaka; Koichiro Yuki, Osaka; Kazuyasu Adachi, Osaka; Masayuki Endo, Osaka; Ichiro Yamashita, Nara, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,695

(22) Filed: May 27, 1999

Related U.S. Application Data

(62) Division of application No. 09/208,753, filed on Dec. 10, 1998, now Pat. No. 5,445,981.

(30) Foreign Application Priority Data

Dec. 12, 1997 (JP) .............................................. 9-342386

(51) Int. Cl.$^7$ ............................................ H01L 29/788
(52) U.S. Cl. ..................... 257/315; 257/316; 257/317; 257/318; 257/319; 257/320; 257/321; 257/322; 257/314; 257/66; 257/67
(58) Field of Search ................................ 257/315–322, 257/314, 66, 67

(56) References Cited

U.S. PATENT DOCUMENTS

| 4,852,062 A | 7/1989 | Baker et al. ................. 365/185 |
| 4,882,707 A | 11/1989 | Mizutani |
| 5,459,091 A | 10/1995 | Hwang |
| 5,519,653 A | 5/1996 | Thomas |
| 5,591,652 A | 1/1997 | Matsushita |
| 5,600,163 A | 2/1997 | Yano et al. |
| 5,687,113 A | 11/1997 | Papadas et al. |
| 5,874,761 A | 2/1999 | Nakao ........................ 257/325 |

FOREIGN PATENT DOCUMENTS

| EP | 0 389 721 A2 | 10/1990 |
| EP | 0 489 465 A2 | 6/1992 |
| EP | 0 763 856 A1 | 3/1997 |
| EP | 0 788 149 A1 | 8/1997 |
| EP | 0 881 691 A2 | 12/1998 |
| JP | 7-111295 | 4/1995 |
| JP | 9-213927 | 8/1997 |
| JP | 5-121763 | 5/1998 |
| WO | WO 96/07487 | 3/1996 |

OTHER PUBLICATIONS

European Search Report, dated Aug. 11, 2000.

(List continued on next page.)

*Primary Examiner*—Fetsum Abraham
(74) *Attorney, Agent, or Firm*—Eric J. Robinson; Nixon Peabody LLP

(57) ABSTRACT

A semiconductor device as a nonvolatile memory comprises dot elements which are formed out of the semiconductor or conductor fine particles and function as a floating gate. The dot elements are asymmetrically formed to a control gate and may be formed in a sidewall insulating film formed over the side face of the control gate or a select gate. When inclined or stepped portions having level differences are formed in a semiconductor substrate, the dot elements are formed on a specified portion of the inclined or stepped portions.

11 Claims, 16 Drawing Sheets-

OTHER PUBLICATIONS

A. Hartmann and S. Seeger, Direct Immobilization of Antibodies on Phtalocyaninato–Polysiloxane Photopolymers, Thin Solid Films, CH, Elsevier–Siquoia S.A. Lausanne, vol. 243, No. 1/02 Jun. 1, 1994 pp. 206–210.

Nakajima A et al. Room Temperature of Si Single–Electron Memory With Self–Aligned Floating Dot Gate, International Electron Devices Meeting (IEDM), US New York, Dec. 8, 1996, pp. 952–954.

Welser J J et al., Room Temperature Operation of a Quantum–Dot Flash Memory, IEEE Electron Device Letters, US IEEE Inc. New York, vol. 18, No. 6 Jun. 1, 1997 pp. 278–280.

S. Tiwari et al., "Volatile and Non–Volatile Memories in Silicon with Nano–Crystal Storage", IEDEM Tech. Digest 521 (1995).

European Search Report.

European Patent Office, Patent Abstracts of Japan Publication No. 06120481, Apr. 28, 1994.

European Patent Office, Patent Abstracts of Japan Publication No. 10144877, May 29, 1998.

European Patent Office, Patent Abstracts of Japan Publication No. 07115142, May 2, 1995.

Geoffrey A. Ozin, "Nanochemistry: Synthesis in Diminishing Dimentions", 6156 Advanced Materials, October 1, 1992, vol. 4, No. 10, pp. 612–649.

H. Sasabe et al., "Two–dimensional molecular packing of proteins", Thin Solid Films, vol. 216, No. 1, Aug. 28, 1992, pp. 99–104.

J. Y. Wang et al., "Formation of nonoscale size cadmium sulfide within a channel protein monolayer", Thin Solid Films, vol. 242, No. ½, Apr. 15, 1994, pp. 127–131.

Ronald P. Andreas et al., "Self–Assembly of Two–Dimensional Superlattice of Molecularly Linked Metal Clusters", Science, US, American Association for the Advancement of Science, vol. 273, Sep. 20, 1996, pp. 1690–1693.

S. Tiwari et al., "Single charge and confinement effects in nano–crystal memories", Applied Physica Letters, vol. 69, No. 9, Aug. 26, 1996, pp. 1232–1234.

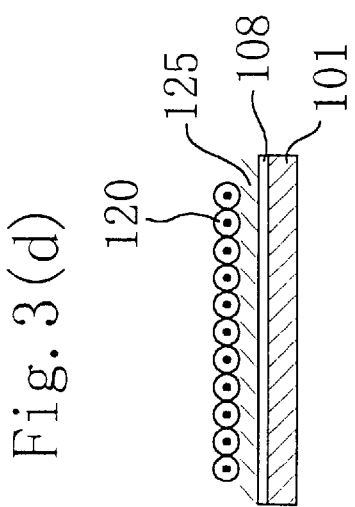
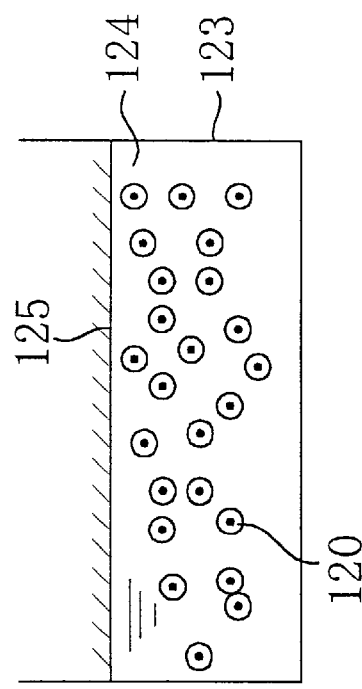
Fig.3(a)  Fig.3(d)
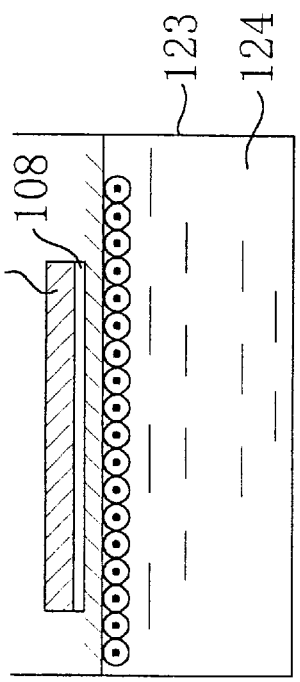
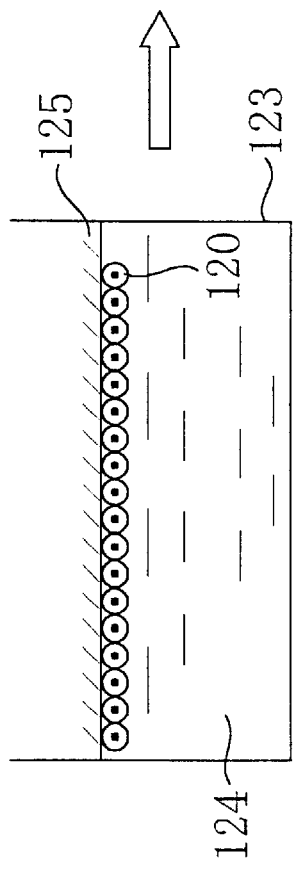
Fig.3(b)  Fig.3(c)

SEMICONDUCTOR DEVICE HAVING DOT ELEMENTS AS FLOATING GATE

This application is a Divisional of application Ser. No. 09/208,753, filed Dec. 10, 1998 now U.S. Pat. No. 5,445,981.

BACKGROUND OF THE INVENTION

The present invention relates to a method for forming a dot element, a semiconductor device using the dot element and a method for fabricating the device. More particularly, the present invention relates to a method for forming a dot element out of an ultrafine particle of the size of several nanometers and functioning as a quantum dot element, a semiconductor device using the dot element and a method for fabricating the device.

Currently, a ULSI is formed by integrating a great number of MOS devices on a single chip. In general, as an MOS device is miniaturized, the performance thereof is enhanced correspondingly. However, if the gate length thereof is 0.1 $\mu$m or less, then the device can hardly operate normally as a transistor, because such a size is a physical limit for the device. A single-electron tunneling device, called a "coulomb blockade", has attracted much attention, recently as a candidate for breaking through such a limit (Kenji Taniguchi et al., FED Journal, Vol. 6, No. 2, 1995). In principle, a single-electron tunneling device performs logical operations and storing operations by controlling the movement of individual electrons, and is very effective in reducing power consumption. However, in order to form a single-electron tunneling device, semiconductor or metal fine particles of the size of several nanometers, called "quantum dot elements", are required. As disclosed in Japanese Laid-Open Publication No. 9-69630, for example, if a large number of Au dot elements are formed out of Au fine particles by sputtering or the like between metal electrodes formed on a substrate, then the Au dot elements form multiple bonds with each other, thereby realizing single-electron effects. In accordance with this method, however, it is very difficult to accurately control the positions where the Au dot elements are formed.

Thus, Sato et al. proposed another method for forming a dot element. In accordance with the method of Sato et al., 3-(2-aminoethylamino)propyltrimethoxy silane (APTS) is deposited on a substrate on which a PMMA resist pattern has been formed. Then, APTS on the PMMA resist is partially lifted off together with an unnecessary portion of the PMMA resist, thereby selectively leaving APTS at desired positions on the substrate. Thereafter, Au fine particles are attached onto only APTS, thereby forming Au dot elements.

Aside from the single-electron tunneling device, a different method for breaking through the limit of a device size using dot elements was also proposed. For example, S. Tiwari et al. disclosed in IEDEM Tech. Digest, 521 (1995) that an operating voltage would be lowered by using dot elements of silicon fine particles for the floating gate of a nonvolatile memory or the like. Tiwari et al. suggested that silicon dot elements could be formed directly on a substrate by performing a CVD process on accurately controlled conditions.

However, the methods of T. Sato et al. and Tiwari et al. have the following problems.

To control the positions of dot elements on a substrate by the method of T. Sato et al., the process steps of forming a PMMA resist pattern or the like on the substrate and then lifting off APTS with unnecessary portions of the PMMA resist pattern are required. Thus, the fabrication process is adversely complicated. In addition, in this method, the Au dot elements are formed onto APTS by utilizing the polarization of charges. Accordingly, if charges have been polarized at other sites on the semiconductor substrate, then Au fine particles are unintentionally attached to such sites. Therefore, it is not always possible to selectively form the Au dot elements only at desired sites.

On the other hand, in accordance with the method of Tiwari et al., silicon dot elements are directly formed on a substrate by a CVD technique. Thus, it is very difficult to control the sizes and positions of such dot elements on the substrate.

Because of these inconveniences, it is now hard to use dot elements, formed by the conventional methods, as a member of a semiconductor device or as quantum dot elements, in particular. That is to say, in accordance with the conventional methods, a semiconductor device, including dot elements formed with the sizes and positions thereof accurately controlled, is very much less likely to be realized.

SUMMARY OF THE INVENTION

An object of the present invention is to provide a method for forming dot elements while accurately controlling the sizes and positions thereof by taking various measures to precisely control the positions and sizes of fine particles over a substrate. Another object of the present invention is to provide semiconductor device of various types, each including the dot elements functioning as quantum dot elements as a component.

A first method for forming a dot element according to the present invention includes the steps of: a) forming a first compound on a part of a substrate; b) attaching a second compound to the surface of a fine particle, the second compound having such a nature as to be combined with the first compound formed on the substrate; c) combining the first and second compounds together and selectively placing the fine particle only on the part of the substrate where the first compound has been formed, thereby forming a dot element out of the fine particle.

In accordance with the first method, the positional accuracy of the dot elements can be controlled based on the position of the first compound formed on the substrate. In addition, only by selecting fine particles of a desired uniform size from the beginning, the sizes of the dot elements can be easily controlled. Accordingly, the positions and sizes of dot elements can be accurately controlled by performing a simple process, without any need for complicated process steps. As a result, dot elements, functioning as quantum dot elements in a device, can be practically formed.

In one embodiment of the present invention, both the first and second compounds are preferably organic compounds.

In another embodiment of the present invention, one of the first and second compounds may be an antigen and the other may be an antibody of the antigen.

In such an embodiment, a dot element can be formed such that the fine particle is fixed at a desired position, not undesired position, with a lot more certainty by taking advantage of the high selectivity of an antigen-antibody reaction.

In still another embodiment, at least one of the first and second compounds may be a protein or an enzyme.

In such an embodiment, the above effects can be attained because a protein or an enzyme is generally likely to react with a particular material.

In still another embodiment, in the step a), an energy wave is preferably irradiated onto only a part of the substrate after the first compound has been formed on the substrate.

In such an embodiment, the first compound can be easily left only at a particular site on the substrate by appropriately selecting the first compound and the energy wave.

In still another embodiment, the energy wave may be selected from the group consisting of: light; X-rays; and electron beams.

In still another embodiment, the dot elements may be formed in matrix by using an interference pattern of the energy wave as the energy wave.

In such an embodiment, a matrix of regularly arranged dot elements can be provided as a component of a device.

In still another embodiment, an electron beam irradiated by an atomic force microscope or a scanning tunneling microscope may be used as the energy wave.

In still another embodiment, a gold fine particle may be used as the fine particle.

In such an embodiment, a dot element functioning as a quantum dot element can be formed particularly easily, because gold fine particles have already been practically used as ultrafine particles of the size in the range from 1 to 10 nm.

In still another embodiment, the first method may further include, posterior to the step c), the step of d) directly fixing the dot element onto the substrate by removing the first and second compounds.

In such an embodiment, a useful dot element can be formed with inconveniences avoided, even when the existence of the first and second compounds is unfavorable for the operation of the device.

In still another embodiment, the step d) may be performed by bringing the first and second compounds into contact with oxygen plasma or carbon dioxide in a supercritical state.

In such an embodiment, part of the dot elements can be removed without displacing the dot elements from the fixed positions thereof. Accordingly, the final positions of the dot elements fixed can be more accurate.

A second method for forming a dot element according to the present invention includes the steps of: a) forming a protein thin film on a substrate, the protein thin film including a plurality of shells, each having an, inner hollow, and conductor or semiconductor fine particles encapsulated in the inner hollows of the shells; b) removing the shells from the protein thin film on the substrate, thereby leaving only the fine particles in the thin film like a layer on the substrate; and c) patterning the layer of the fine particles, thereby forming dot elements out of the fine particles on the substrate.

In accordance with the second method, dot elements can be formed by using a protein containing a conductor or a semiconductor.

In one embodiment of the present invention, the step a) may include the sub-steps of: i) preparing a solution containing the protein and a film-forming material having an affinity with the protein; ii) forming an affinitive film out of the film-forming material on the surface of the solution; iii) attaching the protein to the affinitive film, thereby forming a single-layered film of the protein; and iv) immersing the substrate in the solution and then lifting the substrate out of the solution, thereby attaching the single-layered film of the protein and the overlying affinitive film to the substrate.

In such an embodiment, dot elements can be easily formed by using a so-called Langmuir-Blodgett film.

In another embodiment of the present invention, the protein may be ferritin and the film-forming material may be polypeptide, for example.

In still another embodiment, in the step b), the fine particles may be left at a pitch determined by selecting a type of the protein shell or by adding, substituting or eliminating a group.

A semiconductor device according to the present invention functions as a nonvolatile memory cell. The semiconductor device includes: a semiconductor substrate; a tunnel insulating film, which is formed on the semiconductor substrate and has a such a thickness as to allow electrons to be tunneled therethrough; dot elements, which are formed out of semiconductor or conductor fine particles on the tunnel insulating film and function as a floating gate; a control gate for controlling the movement of electrons between the dot elements and the semiconductor substrate; an interelectrode insulating film interposed between the dot elements and the control gate; and source/drain regions formed in the semiconductor substrate so as to sandwich the dot elements therebetween.

In the semiconductor device, the floating gate of the nonvolatile memory cell is composed of the dot elements formed out of fine particles. Thus, the level of current or power consumption for injecting charges into the floating gate or taking out electrons therefrom can be reduced.

In one embodiment of the present invention, the dot elements are preferably formed only under the control gate.

In such an embodiment, it is possible to prevent without fail an electric shortcircuit from being generated between the floating gate and the source/drain regions or between the source/drain regions themselves.

In another embodiment of the present invention, the dot elements may be asymmetrically formed under the control gate to be closer to one of the source/drain regions.

In such an embodiment, since the number of dot elements can be reduced, the power consumption can be reduced during an erase operation. In addition, if the dot elements are selectively formed at such a region that the dot elements can function as a floating gate most effectively during write, read and erase operations, power consumption and operating voltage can be even more reduced.

In still another embodiment, the dot elements are preferably formed under the control gate to be closer to a region functioning as a drain during writing.

In such an embodiment, while a write operation is performed using channel hot electrons, the dot elements are located over a region where electrons, moving from the source to drain region, are most accelerated. As a result, write current can be reduced and power consumption can be reduced.

In still another embodiment, the control gate may be formed over the semiconductor substrate with a gate insulating film interposed therebetween. And the device may further include: a protective insulating film covering a side face of the control gate and including a part functioning as the interelectrode insulating film; and a sidewall insulating film formed over the side face of the control gate with the protective insulating film interposed therebetween. And the dot elements may be buried in the sidewall insulating film so as to be located over the semiconductor substrate through the tunnel insulating film.

In such an embodiment, the above effects can also be attained, because the dot elements can be formed in the vicinity of the source or drain region. Also, the nonvolatile memory cell may be formed as a transistor of a so-called LDD type by using the sidewall insulating film. Thus, a structure advantageous to miniaturization can be obtained.

In such a case, the dot elements may be formed only in a part of the sidewall insulating film closer to the drain or source region.

In still another embodiment, the semiconductor device may further include: a select gate formed over the semiconductor substrate with a gate insulating film interposed therebetween; a protective insulating film covering a side face of the select gate; and a sidewall insulating film formed over the side face of the select gate with the protective insulating film interposed therebetween. The dot elements may be buried in the sidewall insulating film so as to be located over the semiconductor substrate through the tunnel insulating film. And the control gate may be formed so as to cover the sidewall insulating film through an interelectrode insulating film.

In such an embodiment, since the device also includes the select gate functioning as a select transistor, a highly reliable nonvolatile memory cell consuming even small power can be obtained.

In still another embodiment, an inclined portion having a level difference may be formed in part of the principal surface of the semiconductor substrate. The gate insulating film may be formed so as to overlap the inclined portion. And the dot elements may be formed on either a slope or a lower-level portion of the inclined portion, the lower-level portion being located adjacent to the slope.

In such an embodiment, the dot elements functioning as a floating gate are located just in the direction toward which channel hot electrons are moving during writing. Accordingly, write efficiency can be improved and power consumption can be further reduced.

In still another embodiment, a stepped portion having a level difference may be formed in part of the principal surface of the semiconductor substrate. The gate insulating film may be formed so as to overlap the stepped portion. And the dot elements may be formed to be self-aligned with a part of the gate insulating film on a side face of the stepped portion.

In such an embodiment, the dot elements can be formed to be self-aligned with only the side face of the stepped portion in accordance with the first or second method for forming a dot element of the present invention. Accordingly, if the dot elements are used as a charge storage such as a floating gate, a memory device, which can be satisfactorily controlled during writing and reading, is obtained.

In still another embodiment, the substrate may be a silicon substrate, the principal surface of which is a {111} plane, and the side face of the stepped portion may be a {100} plane.

In such an embodiment, electrons can be injected into the dot elements even more easily by using channel hot electrons, because a thermally oxidized film is thicker on the {111} plane but thinner on the {100} plane.

In still another embodiment, the semiconductor substrate may be an SOI substrate including an insulator layer under a semiconductor layer.

In such an embodiment, a high-speed operating nonvolatile memory cell can be obtained.

In still another embodiment, the dot elements may be formed out of silicon or metal fine particles.,

BRIEF DESCRIPTION OF THE DRAWINGS

FIGS. 3(a) through 3(d) are cross-sectional views illustrating respective process steps for forming a dot element in the second embodiment.

DESCRIPTION OF THE PREFERRED EMBODIMENTS

EMBODIMENT 1

Hereinafter, the first embodiment of the present invention will be described with reference to the drawings. FIGS. 1(a) through 1(d) are cross-sectional views illustrating respective process steps for forming a dot element in the first embodiment.

Figure 1A:
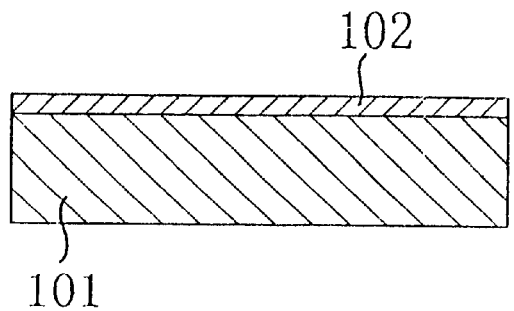
FIGS. 1(a) through 1(d) are cross-sectional views illustrating respective process steps for forming a dot element in the first embodiment.

First, in the step shown in FIG. 1(a), a Rat IgG antibody film 102 is formed on a p-type Si substrate in accordance with a spin coating method or a submerged adsorption method. Specifically, the Rat IgG antibody film 102 may be formed easily by spin-coating the substrate with a thin film of acetyl cellulose containing the Rat IgG antibody, for example.

Figure 1B:
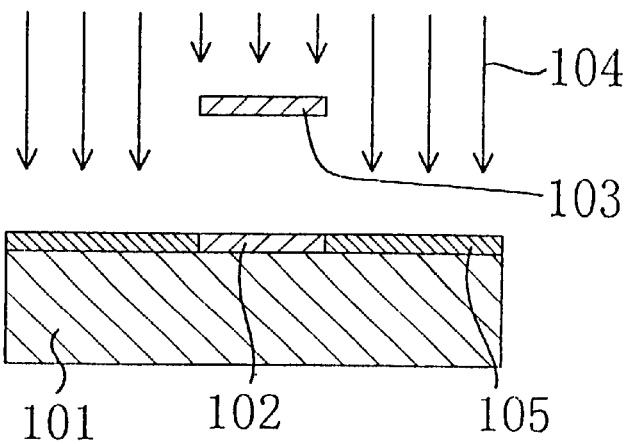

Next, in the step shown in FIG. 1(b), a photo mask 103 for blocking light from reaching only a part of the p-type Si substrate 101 is prepared. And ultraviolet rays 104 are selectively irradiated from above the photo mask 103 onto the Rat IgG antibody film 102 except for that part. A portion of the Rat IgG antibody film 102 that has been irradiated with the ultraviolet rays 104 loses its activity as an antibody owing to the energy of the ultraviolet rays 104 to be a deactivated Rat IgG antibody film 105. The other portion of the Rat IgG antibody film 102 that has not been irradiated with the ultraviolet rays 104 still retains its activity as an antibody.

Figure 1C:
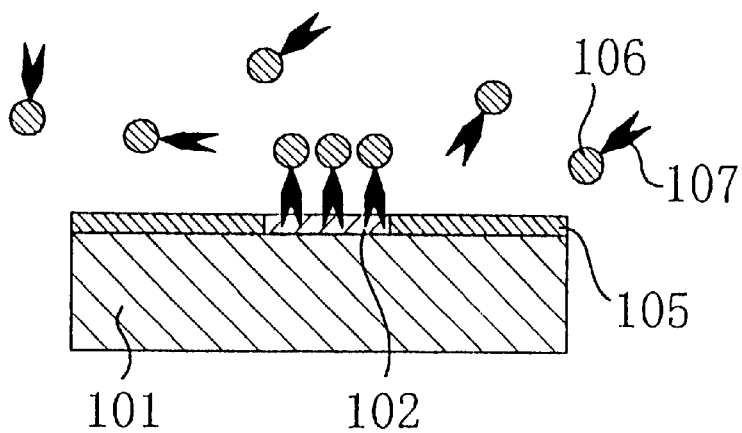

Then, in the step shown in FIG. 1(c), a solution containing Au fine particles 106 combined with a Rat IgG antigen 107 is prepared. And the p-type Si substrate 101, on which the Rat IgG antibody film 102 has been formed, is immersed in the solution for five to ten hours (a container is not shown in FIG. 1(c)). As a result of this process, the Rat IgG antigen 107, combined with the Au fine particles 106, is selectively combined with the Rat IgG antibody film 102 on the p-type Si substrate 101. Consequently, the Rat IgG antigen 107, combined with the Au fine particles 106, is fixed on the Rat IgG antibody film 102. On the other hand, since the deactivated Rat IgG antibody film 105 has lost its activity as an antibody owing the irradiated ultraviolet rays 104, the Rat IgG antigen 107 is not fixed onto the deactivated Rat IgG antibody film 105. Accordingly, the Rat IgG antigen 107, combined with the Au fine particles 106, is fixed only on the Rat IgG antibody film 102 on the p-type Si substrate 101.

Figure 1D:
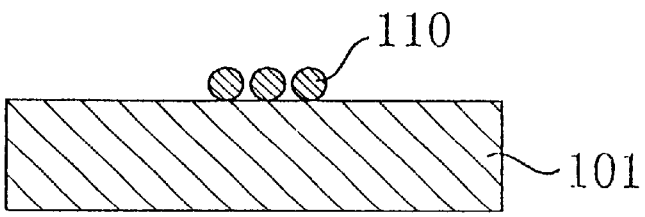

Subsequently, in the step shown in FIG. 1(d), the p-type Si substrate 101 is exposed to oxygen plasma for twenty minutes. As a result of this process, the Rat IgG antibody film 102, the deactivated Rat IgG antibody film 105 and the Rat IgG antigen 107 on the p-type Si substrate 101 are all dissolved by the oxygen plasma. In other words, the Rat IgG antibody film 102 and the Rat IgG antigen 107, which have been interposed between the Au fine particles 106 and the p-type Si substrate 101, are dissolved to disappear. Consequently, dot elements 110 of a desired size are formed out of the Au fine particles at desired positions on the p-type Si substrate 101.

In accordance with the method of this embodiment, the positions, where the dot elements 110 are formed, are determined by the pattern and position of the photo mask 103 during a single photolithography process. Thus, in this embodiment, accurate control is realized without performing the complicated process of T. Sato et al. Also, unlike the method of Tiwari et al., Au fine particles 106, which have already been formed separately to have a uniform particle size, can be used. Accordingly, the sizes of the dot elements 110 can also be controlled accurately. Moreover, since the antigen-antibody reaction has very high selectivity, the dot elements 110 are not formed at undesired positions unlike the method of T. Sato et al. Therefore, the positions and sizes of the dot elements 110 can be controlled accurately, and a semiconductor device, including quantum dot elements as a component and attaining various functions and excellent characteristics, is realized.

In this embodiment, a p-type Si substrate is used as a substrate on which the dot elements are formed. Alternatively, any other material may be used so long as an antigen or antibody can be formed on the surface thereof. Also, any material other than silicon, such as silicon oxide or silicon nitride, may be naturally formed on the p-type Si substrate 101.

Ultraviolet rays are used in this embodiment for partially deactivating the antibody. Alternatively, any other energy wave such as X-rays, electron beams or ion beams may also be used so long as the energy wave can partially deactivate the antibody. The irradiation of electron beams may be performed not only in vacuum, but also by using an atomic force microscope (AFM), a scanning tunneling microscope (STM) or the like in the atmosphere.

Also, assume an interference pattern is formed on the Rat IgG antibody film 102, formed on the p-type Si substrate 101, by irradiating the film 102 with F2 vacuum ultraviolet laser light at a tilt angle. The laser light has been divided into two luminous fluxes and then superimposed with each other. Then, part of the interference pattern on the Rat IgG antibody film 102, which has been exposed to the light at a higher intensity, is deactivated to form a striped Rat IgG antibody film 102. Furthermore, the same two luminous fluxes of the F2 vacuum ultraviolet laser light may be superimposed with each other and irradiated at a tilt angle onto the p-type Si substrate 101 after the substrate 101 has been rotated by 90 degrees horizontally. Then, a Rat IgG antibody film 102 can be finally formed in the shape of a matrix of several square nanometers. In forming an interference pattern of the laser light, an island is formed at a pitch determined by a wavelength and an incident angle. Thus, the size of the Rat IgG antibody film 102 can be arbitrarily set.

In this embodiment, Au fine particles commercially available from British Bio Cell Corporation (particle size is 1, 2, 5 or 10 nm) are used. Though Au fine particles are used in this embodiment, any other fine particles such as Si, Ti or GaAs may also be used so long as the fine particles can be combined with an antigen or antibody.

In this embodiment, a Rat IgG antibody film is first formed on a substrate and then a Rat IgG antigen, combined with Au fine particles, is used. Alternatively, the antigen and the antibody may be interchanged. That is to say, an antigen may be formed first on a substrate and then Au fine particles may be modified with an antibody. It is noted that an "antigen" is herein a generic term for various substances capable of inducing antigen-antibody reactions and immune response. In the world of nature, the "antigen" includes proteins, polysaccharides, compounds thereof and compound lipids, each having a molecular weight of about 1,000 or more. On the other hand, an "antibody" is herein a generic term for proteins produced in a living body in response to the stimulation of an antigen and combined specifically to the antigen.

In this embodiment, a combination of a Rat IgG antibody and a Rat IgG antigen is used. Alternatively, any antibody selected from the group consisting of: a Rabbit IgG antibody; a Mouse IgG antibody; a Human IgG antibody; a Guinea Pig IgG antibody; a Chicken IgG antibody; a Goat IgG antibody; and a Sheep IgG antibody may be used in combination with an associated antigen thereof.

However, it is noted that, according to the present invention, a combination of a first compound combined with fine particles and a second compound selectively combined with the first compound is not limited to the combination of an antigen and an antibody. Alternatively, any other combination of compounds, e.g., a combination of a protein and an enzyme, may also be used so long as the pair can be selectively combined with each other.

Furthermore, the film of the first compound formed on the substrate may be made of any other material so long as the activity of the film is selectively variable in response to light, electron beams or the like. Thus, a film containing a silane coupling agent including a vinyl group (such as bis (dimethylamino)methylvinyl silane, tris(1-methylvinyloxy) vinyl silane) or the like) may be used. In such a case, an antigen or antibody combined with fine particles is sometimes unnecessary.

In this embodiment, oxygen plasma is used for removing the antigen and antibody from the substrate. However, if any substance, which is likely to be affected by oxygen plasma, exists on the substrate, then the organic substances such as an antigen or an antibody may be removed from the substrate by bringing the surface of the substrate into contact with carbon dioxide in a super critical state. In such a case, the removal efficiency can be naturally improved if any other solvent is mixed therein as an entrainer.

EMBODIMENT 2

Next, the second embodiment of the present invention will be described with reference to the drawings. In this embodiment, a method for forming a dot element using a metalprotein compound such as ferritin will be described.

Figure 2:
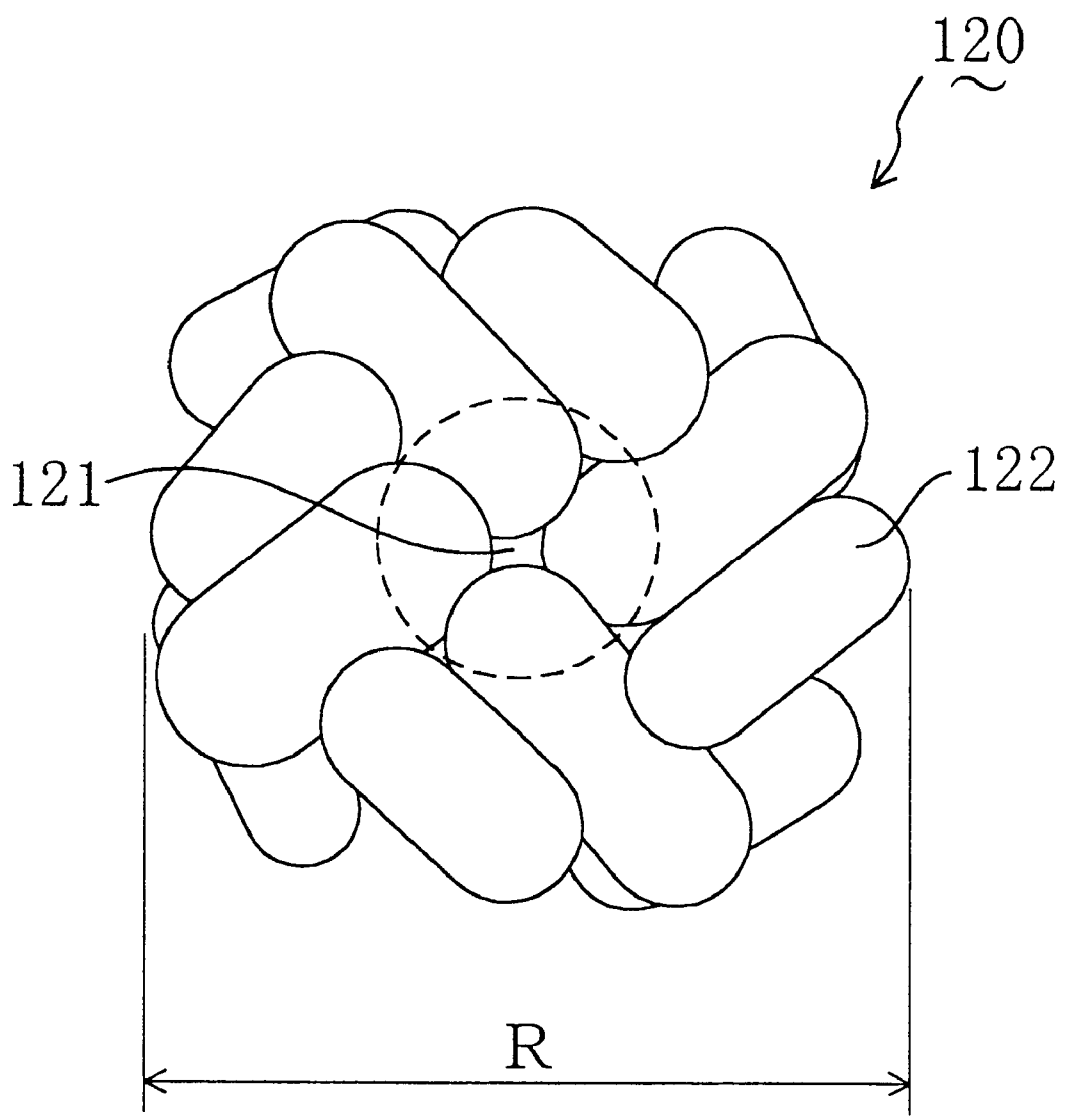
FIG. 2 is a schematic representation illustrating a molecular structure of ferritin in the second embodiment.

First, ferritin powder is prepared as a source material. FIG. 2 is a schematic representation illustrating the molecular structure of ferritin. As shown in FIG. 2, ferritin 120 is a metal-protein compound, in which a core 121 of $Fe_2O_3$ is surrounded by protein shells 122, and can be extracted from an animal viscus such as equine or bovine spleen or liver. The diameter of the core 121 is about 6 nm, and the total number of iron atoms thereof is in the range from about 2,000 to about 3,000. The shell 122 is a *24 monomers of a protein having a molecular weight of about 20,000 and the outer diameter R of the *24 monomers is about 12 nm.

Next, a method for forming a dot element using ferritin 120 will be described. FIGS. 3(a) through 3(d) are cross-sectional views illustrating respective process steps for forming a dot element in this embodiment.

First, as shown in FIG. 3(a), a buffer solution 124 is reserved in a water tank 123 made of Teflon, ferritin 120 is dispersed in the buffer solution 124 and a polypeptide film (i.e., a film for forming a Langmuir-Blodgett film) is formed on the surface of the buffer solution 124. The pH of the buffer solution 124 is adjusted at about six by using an appropriate acid such as very rare hydrochloric acid.

Before long, as shown in FIG. 3(b), ferritin 120 attaches to the polypeptide film 125, because the polypeptide film 125 is positively charged, whereas ferritin 120 is negatively charged. As a result, two-dimensional crystals of ferritin 120 are formed.

Thereafter, as shown in FIG. 3(c), a p-type Si substrate 101, on which a silicon dioxide film 108 has been formed, is floated on the surface of the buffer solution 124, thereby attaching the polypeptide film 125 and the two-dimensional crystals of ferritin 120 to the surface of the p-type Si substrate 101. And then the substrate 101 is taken out of the water tank 123.

As a result, as shown in FIG. 3(d), the two-dimensional crystals of ferritin 120 are formed over the p-type Si substrate 101 with the silicon dioxide film 108 and the polypeptide film 125 interposed therebetween. Thereafter, the substrate is placed within an inert gas (e.g., nitrogen plasma) which is less likely to react with silicon, and then subjected to a heat treatment at 500° C. Consequently, the protein in ferritin 120 and the polypeptide film 125 disappear almost entirely, whereby dot elements are left as an assembly of ferrous oxides included in the inner hollows of the ferritin molecules, which formed the two-dimensional crystals. That is to say, a large number of mutually isolated dot elements are obtained. If it is hard to conduct a heat treatment, the protein and the polypeptide film may be removed by bringing the surface of the substrate in contact with silicon dioxide in a super-critical state or the like. The efficiency of the removal can be naturally improved if any other solvent is mixed as an entrainer.

Figure 4:
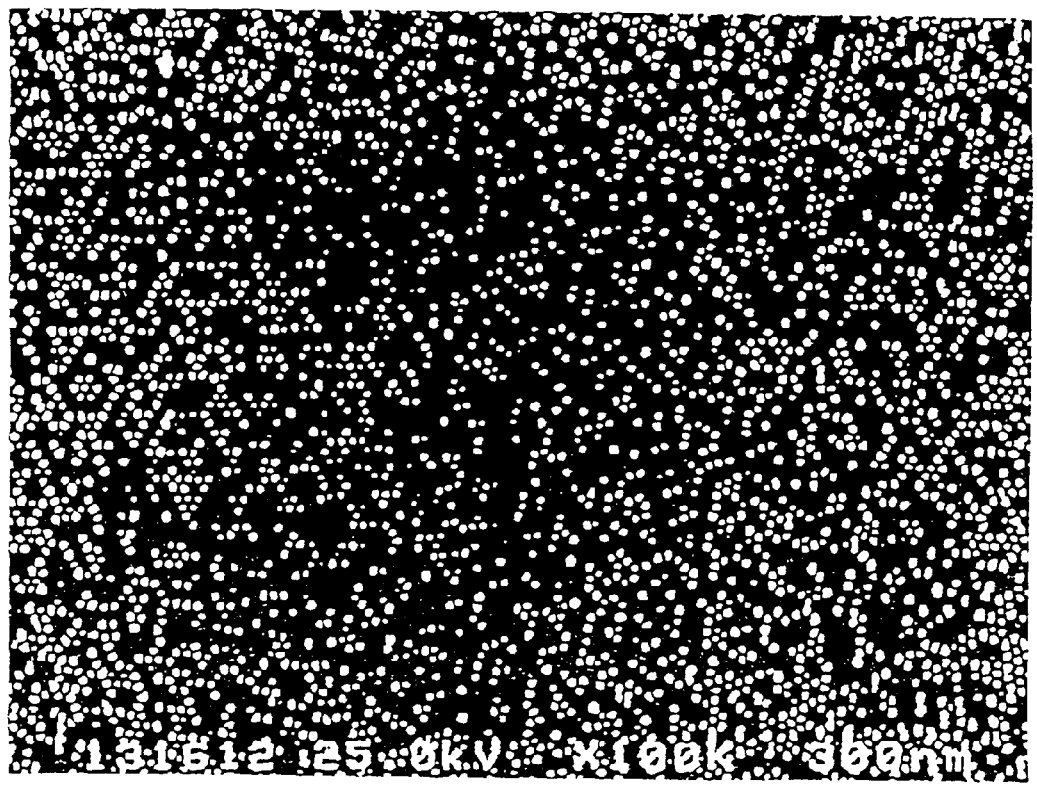
FIG. 4 is a copy of an SEM photograph showing the surface of a silicon substrate on which a polypeptide film and a ferritin film have been formed and which is subjected to a heat treatment.

FIG. 4 is a copy of an SEM photograph showing the surface of the silicon substrate on which the polypeptide film and the ferritin film were formed and which was subjected to a heat treatment at 500° C. for an hour (the scale is 1: 100,000). In FIG. 4, a large number of white dots are dot elements of a ferrous oxide, while the other dark parts are a very small amount of residual protein and the silicon substrate. As can be estimated from FIG. 4, the dot elements of ferrous oxide are located at respective sites where the cores 121 of the ferritin molecules as two-dimensional crystals used to exist.

Thereafter, the entire substrate, on which the ferrous oxide dot elements are formed, is subjected to a heat treatment again within hydrogen at a temperature in the range from about 300 to about 500° C. for about 60 minutes. As a result, the ferrous oxide dot elements are reduced to be iron dot elements.

Figure 5:
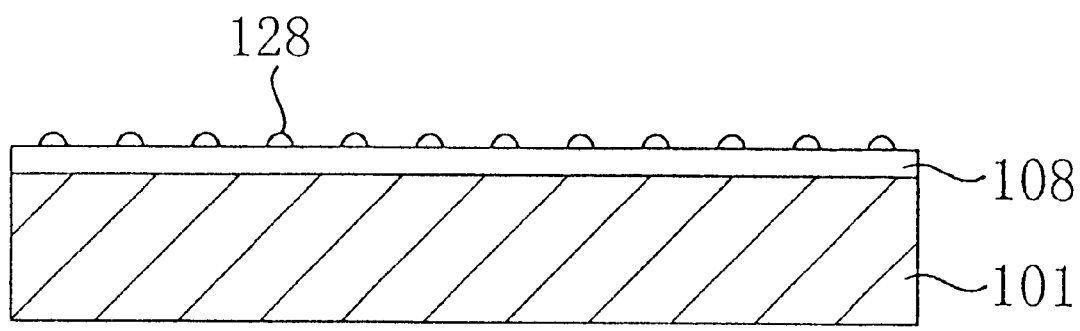
FIG. 5 is a cross-sectional view illustrating a state of the substrate subjected to the heat treatment in the second embodiment.

FIG. 5 is a cross-sectional view illustrating a state of the substrate that has been subjected to the heat treatment. As shown in FIG. 5, the Fe dot elements 128 are arranged two-dimensionally over the p-type Si silicon substrate 101 with the silicon dioxide film 108 interposed therebetween. The two-dimensional arrangement of the Fe dot elements 128 was confirmed by an AFM analysis. As a result of the analysis, the height of the dot elements 128 was either 5.3 nm or 10.6 nm, and the majority of the dot elements 128 were 5.3 nm high.

The diameter of the dot element 128 is about 6 nm, which is substantially equal to that of the ferrous oxide core in ferritin. A pitch between dot elements 128 is about 12 nm, which is substantially equal to the diameter R of the protein shell 122 in ferritin 120.

In this embodiment, the dot elements are formed out of Fe fine particles. Alternatively, the dot elements may be ferrous oxide dot elements.

Also, the protein for forming dot elements may be any of various kinds of proteins including a metal such as hemoglobin, adenovirus or globular virus such as T4 phage, instead of ferritin. Since the sizes of these proteins are different from each other (some of them have a particle size as large as about 100 nm) and can also be artificially changed by adding, substituting or eliminating various groups to the shells, dot elements can be arranged at a desired pitch.

The size of a dot element itself can also be controlled. For example, if the shell thickness of a protein such as adenovirus or polyoma is changed in accordance with genetic engineering technologies, then the size of the inner hollow of the shell may also be changed. And it is possible in. turn to change the diameter of a metal (or metal oxide) fine particle included in the shell. In other words, the diameter of a fine particle may be changed not only by substituting a different kind of protein, but also by an artificial adjustment.

The absolute magnitude (i.e., the number of atoms or molecules) of a metal (or metal oxide) encapsulated in the inner hollow of a protein shell is determined by the size of the inner hollow. However, it was reported that an Fe core surround by Mn can be formed in the inner hollow of ferritin (see, for example, F. C. Meldrum, T. Douflas, S. Levi, P. Arosio and S. Mann, "Reconstitution of Manganese Oxide Cores in Horse Spleen and Recombinant Ferritins", 1995 J. Inorg. Biochem. 58:59–68). Thus, if such a technique is used, a dot element having a concentric structure of two or three kinds of metals may also be formed.

Also, it was reported that ferritin may include the following metals (or metal oxides) other than Fe: Al (J. Fleming, 1987 Proc. Natl. Acad. Sci. USA 84: 7866–7870); Be (D. J. Price, 1983 J. Biol. Chem. 258: 10873–10880); Ga (R. E. Weiner, 1985 J. Nucl. Med. 26: 908–916); Pb (J. Kochen, 1975 Prediatr. Res. 9: 323 (abst. #399)); Mn (P. Mackle, 1993 J. Amer. Chem. Soc. 115: 8471–8472, etc.); P (A. Treffy, 1978 Biochem. J. 171: 313–320, etc.); U (J. F. Hainfeld, 1992 Proc. Natl. Acad. Sci. USA 89: 11064–11068); and Zn (D. Price, 1982 Proc. Natl. Acad. Sci. USA 79: 3116–3119).

It is noted that in order to form a single-layered film of a protein such as ferritin, any method other than the method of this embodiment using a Langmuir-Blodgett film may be employed.

EMBODIMENT 3

Next, the third embodiment of the present invention will be described with reference to the drawings. In the following third to tenth embodiments, examples of nonvolatile memory cells including the dot elements, formed by the method for forming a dot element of the present invention as described in the first and second embodiments, as a floating gate will be described.

Figure 6:
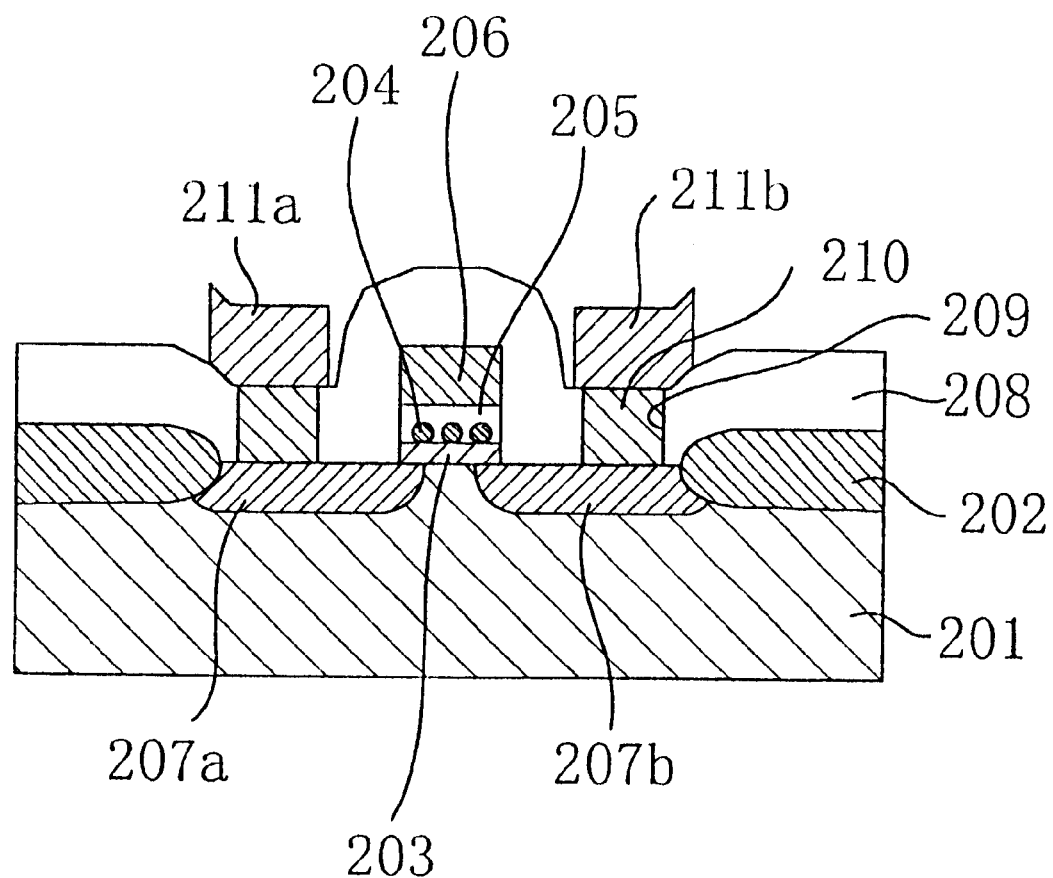
FIG. 6 is a cross-sectional view of a nonvolatile memory cell of the third embodiment including dot elements, formed in accordance with the method of the present invention, as a floating gate.

FIG. 6 is a cross-sectional view illustrating a structure of a nonvolatile memory cell using dot elements as a floating gate. As shown in FIG. 6, a polysilicon electrode 206; dot elements 204; a gate oxide film 203; and a silicon dioxide film 205 are provided over a p-type Si substrate 201. The polysilicon electrode 206 functions as a control gate. The dot elements 204 are formed out of Au, Fe or Si fine particles by the method of the first and second embodiments, have a particle size of several nanometers and functions as a floating gate electrode. The gate oxide film 203 is interposed between the p-type Si substrate 201 and the floating gate and functions as a tunnel insulating film. The silicon dioxide film 205 is formed between the control gate and the floating gate and functions as an interelectrode insulating film for transmitting a voltage applied to the control gate to the floating gate. In the p-type Si substrate 201, first and second n-type diffusion layers 207a and 207b, functioning as source/drain regions, are formed. The region between the first and second n-type diffusion layers 207a and 207b in the p-type Si substrate 201 functions as a channel region. An element-isolating oxide film 202 is formed by a selective oxidation technique or the like between the memory cell illustrated and an adjacent memory cell in order to electrically isolate these cells from each other. The first and second n-type diffusion layers 207a and 207b are connected through tungsten plugs 210 to first and second aluminum interconnects 211a and 211b, respectively. Though not shown in FIG. 6, the polysilicon electrode 206 and the p-type Si substrate 201 are also connected to the aluminum interconnects 211a and 211b. This memory cell is configured such that voltages at respective parts thereof can be controlled through the aluminum interconnects and so on.

Such a structure can be easily formed by performing the process steps shown in FIGS. 7(a) through 7(d).

Figure 7A:
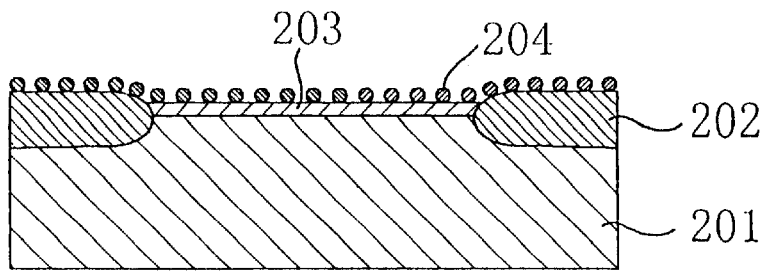
FIGS. 7(a) through (d) are cross-sectional views illustrating respective process steps for fabricating a memory cell in the third embodiment.

First, in the step shown in FIG. 7(a), the element-isolating oxide film 202 is formed by a LOCOS technique on the p-type Si substrate 201 so as to surround an active region, and the gate oxide film 203 is formed on the substrate. Thereafter, the dot elements 204 are formed over the entire surface of the substrate in accordance with the method of the first or second embodiment.

Figure 7B:
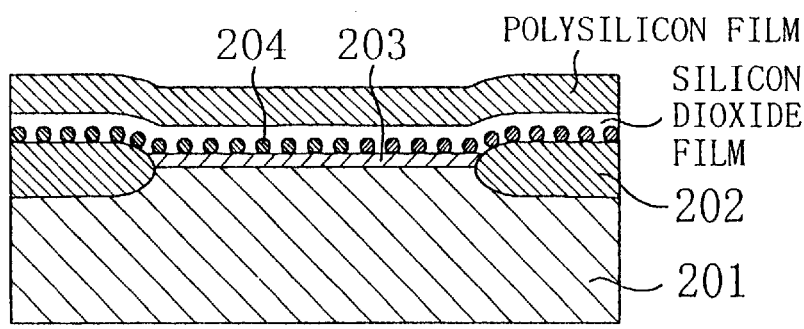

Next, in the step shown in FIG. 7(b), a silicon dioxide film and a polysilicon film are deposited in this order over the substrate by a CVD technique so as to fill in the gaps between the dot elements 204.

Figure 7C:
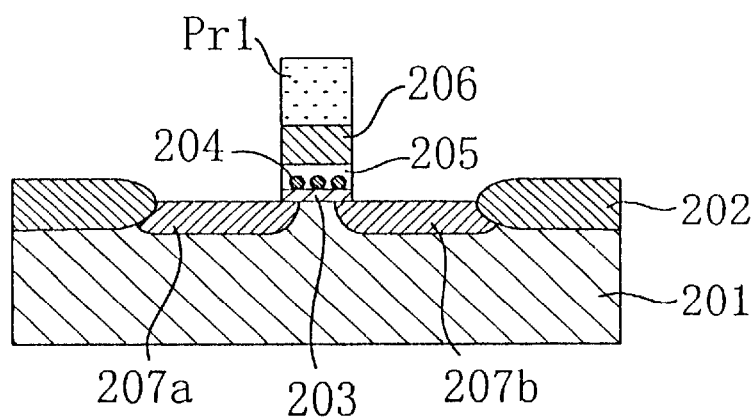

Then, in the step shown in FIG. 7(c), the silicon dioxide and polysilicon films are patterned using a photoresist mask Pr1, thereby forming the silicon dioxide film 205 as an interelectrode insulating film and the polysilicon electrode 206 as a control gate electrode. In this process step, part of the gate oxide film 203, not covered with the photoresist mask Pr1, is removed and the dot elements 204 located over the part are also removed at the same time. Thereafter, dopant ions are implanted using the photoresist mask and the polysilicon electrode 206 as a mask, thereby forming the first and second n-type diffusion layers 207a and 207b.

Figure 7D:
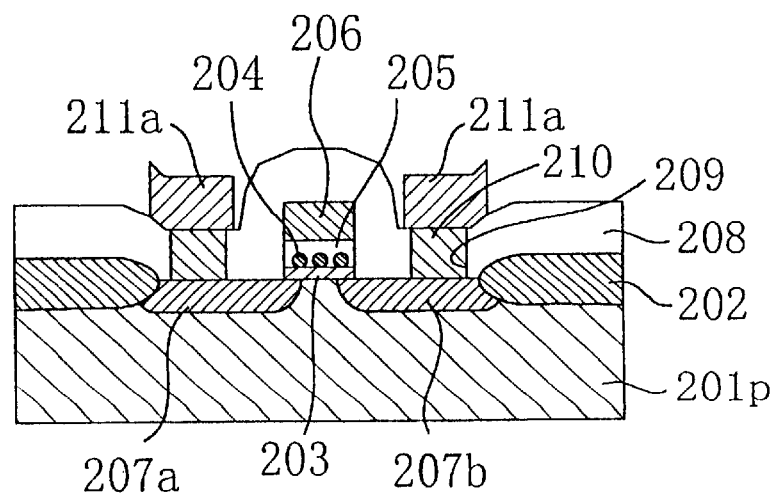

Thereafter, in the step shown in FIG. 7(d), an interlevel dielectric film 208 is formed. Contact holes 209 are opened in the interlevel dielectric film 208. The tungsten plugs 210 are formed by filling in the contact holes 209 with tungsten. And the first and second aluminum interconnects 211a and 211b are formed. All of these parts may be formed by known techniques.

Next, the operation of this memory cell will be described. This memory cell is provided with an,MOS transistor (memory transistor) including the polysilicon electrode 206 as a control gate and the first and second n-type diffusion layers 207a and 207b as source/drain regions. And this is a nonvolatile memory cell for performing read, write and erase operations by sensing a variation in threshold voltages of the memory transistor in accordance with the amount of charges stored in the dot elements 204 functioning as a floating gate.

First, a read operation will be described. The first aluminum interconnect 211a and the p-type Si substrate 201 are grounded and the second aluminum interconnect 211b is allowed to be floating. When an appropriate voltage (e.g., 5 V) is applied to the polysilicon electrode 206 functioning as a control gate, a channel is formed over the p-type Si substrate 201 if charges are not stored in the dot elements 204. Then, the transistor is turned ON, electrons flow from the first to the second aluminum interconnect 211a to 211b and these interconnects will soon have a potential of 0 V. On the other hand, if electrons, i.e., negative charges, are stored in the dot elements 204, then the threshold voltage of the transistor has virtually increased, because electrons exist in the dot elements 204. Therefore, even if a voltage of 5 V is applied to the polysilicon electrode 206 as a control gate, no channel is formed over the p-type Si substrate 201 and no current flows. Accordingly, the potential in the second aluminum interconnect 211b does not become 0 V., By. regarding these two states having mutually different voltages as "0" and "1", a the memory can store binary values.

If the amount of charges stored in the dot elements 204 is also controlled in addition to sensing the existence thereof, a multivalued memory storing tertiary or more values may be realized. In such a case, a circuit for detecting the variation in threshold voltages of the transistor with fine steps is preferably provided.

Next, an erase operation will be described. Fowler-Nordheim (FN) current flowing through the oxide film or direct tunneling current is used for erasure. Assume a negative voltage (e.g., −12 V; this polarity is described with respect to the p-type Si substrate 201) is applied to the polysilicon electrode 206 as a control gate. Then, the electrons stored in the dot elements 204 as a floating gate are tunneled through the gate oxide film 203 to move into the p-type Si substrate 201. As a result, data is erased.

Next, a write operation will be described. Fowler-Nordheim (FN) current flowing through the oxide film, direct tunneling current or injection of channel hot electrons (CHE) is used for writing. In the case of using the FN current or the direct tunneling current, a positive voltage (e.g., +12 V; this polarity is also described with respect to the p-type Si substrate 201) is applied to the polysilicon electrode 206 as a control gate. As a result, electrons are attracted toward the polysilicon electrode 206 facing the p-type Si substrate 201 through the dot elements 204 and tunneled through the gate oxide film 203 to be stored in the dot elements 204 as a floating gate. On the other hand, in the case of injection CHE's, the second aluminum interconnect 211b and the p-type Si substrate 201 are grounded. An appropriate positive voltage (e.g., 5 V) is applied to the first aluminum interconnect 211a. And the voltage in the polysilicon electrode 206 as a control gate is controlled at a value where CHE's are more likely to be generated (e.g., 2.5 V, which is half of the drain voltage). By setting the voltages at such values, most electrons move through the channel formed in the p-type Si substrate 201 from the second to the first n-type diffusion layer 207b to 207a. Some channel hot electrons, however, have got huge energy to be tunneled through the gate oxide film 203 and stored in the dot elements 204 as a floating gate.

In the nonvolatile memory cell of this embodiment, the floating gate is composed of Si fine particles having so small a particle size as to function as quantum dot elements. Thus, a very small amount of charges are stored. Accordingly, the level of current may be reduced during writing and erasing. As a result, a nonvolatile memory cell consuming less power can be formed.

In a floating gate made of fine particles, if only a small number of (typically one) electrons entered ensure a stable state, then the electrons are less likely to be released (i.e., coulomb blockade effect). Thus, if the thickness of the tunnel insulating film is very much reduced to realize a write operation at a high speed and with a low voltage, electrons can still be retained just as expected.

In the nonvolatile memory cell of this embodiment, it is sufficient for the dot elements 204 constituting the floating gate to exist only in the silicon dioxide film 204 interposed between the polysilicon electrode 206 and the p-type Si substrate 201. If the dot elements exist at other sites, an electrically erroneous operation is sometimes caused. For example, assume the dot elements 204 also exist over the first and second n-type diffusion layers 207a and 207b. In such a case, the dot elements 204, which should function as a floating gate, might be electrically short-circuited with the source/drain regions to lose its function of storing charges. Or the first and second n-type diffusion layers 207a and 207b might be electrically continuous with each other. In order to prevent such phenomena, the dot elements 204 are preferably formed only in the region interposed between the polysilicon electrode 206 and the p-type Si substrate 201 in accordance with the method of the first embodiment.

The dot elements 204 may be formed to be continuous or in contact with each other. That is to say, the dot elements 204 may form a single film as a whole. Alternatively, the dot elements 204 may be dispersed and spaced apart from each other as described above.

If the dot elements 204 are dispersed, then the silicon dioxide film 205 exists in the gaps between the dot elements 204 as shown in FIG. 6. Stated otherwise, the dot elements 204 are buried in the silicon dioxide film 205. In such a case, the following effects can be attained. In a floating gate where a conductor exists continuously like a conventional floating gate made of polysilicon, if only a part of an insulating film is broken down, then the charges in the entire floating gate flow into the substrate, whereby the function of the floating gate is lost. By contrast, in a floating gate composed of mutually isolated and insulated dot elements in this embodiment, even if charges are lost from some of the dot elements in the floating gate owing to the deterioration of a part of the tunnel insulating film, charges are still retained in the other dot elements. That is to say, if dot elements such as those of this embodiment are used, the reliability of the semiconductor memory device is also improved.

In this embodiment, the substrate is made of p-type silicon. Alternatively, an n-type Si substrate may be used. Furthermore, a substrate made of a compound semiconductor such as GaAs or any other semiconductor may also be used.

Also, any fine particles other than Si, Au, Fe fine particles may also be used for the dot elements. For example, semiconductor fine particles other than Si fine particles or metal, semiconductor or semi-insulating fine particles such as Ti and GaAs fine particles having a function of storing charges may also be used.

EMBODIMENT 4

Figure 8:
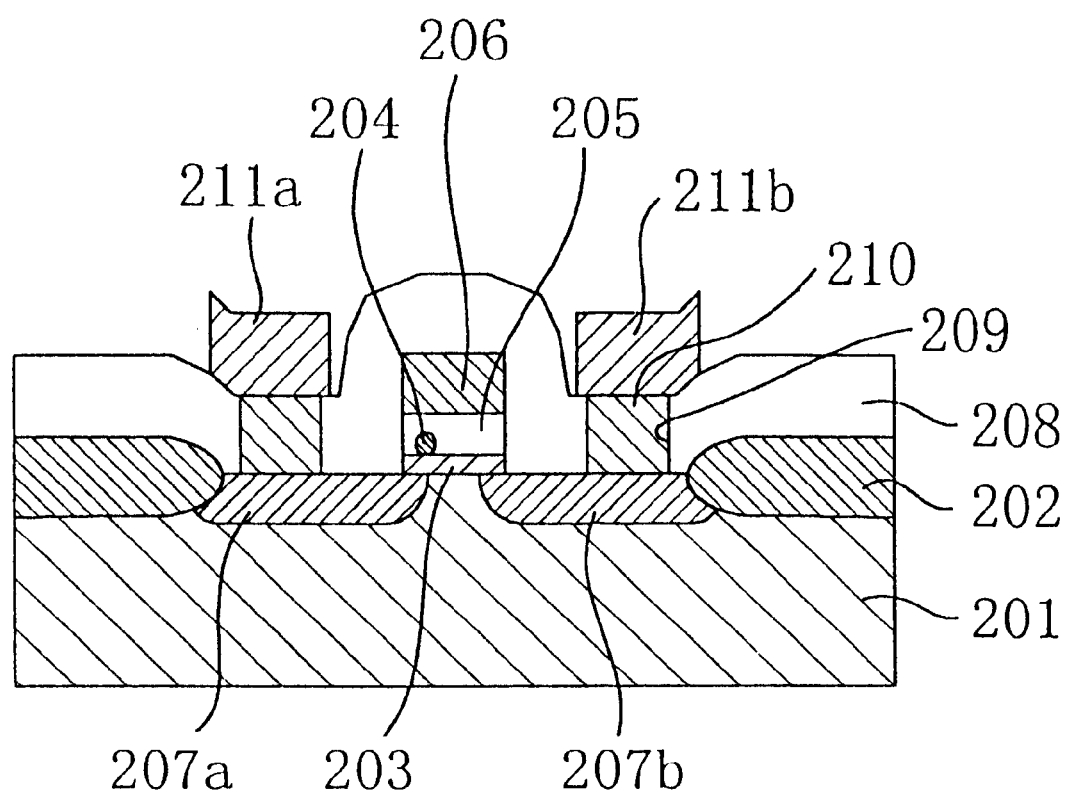
FIG. 8 is a cross-sectional view of a nonvolatile memory cell of the fourth embodiment, in which dot elements are formed only in the vicinity of one end of a diffusion layer in accordance with the method of the present invention.

Next, the fourth embodiment of the present invention, in which the dot elements are locally formed under the control gate electrode, will be described. FIG. 8 is a cross-sectional view illustrating the structure of a nonvolatile memory cell in the fourth embodiment. In FIG. 8, the components having the same structures as the counterparts in FIG. 6 are identified by the same reference numerals, and the structures and functions thereof are just as already described.

As shown in FIG. 8, the structure of the nonvolatile memory cell in this embodiment is almost the same as that of the nonvolatile memory cell shown in FIG. 6. This embodiment is different from the third embodiment in that the dot elements 204 constituting a floating gate are formed only in the vicinity of the first n-type diffusion layer 207a.

Such a structure can be easily formed by performing the following process steps. First, the gate oxide film 203 is formed on the p-type Si substrate 201. Thereafter, the dot elements 204 are formed in a region over the gate oxide film 203 and in the vicinity of one end of the first n-type diffusion layer 207a in accordance with the method of the first embodiment. Next, a silicon dioxide film and a polysilicon film are deposited thereon and patterned, thereby forming the silicon dioxide film 205 as an interelectrode insulating film and the polysilicon electrode 206 as a control gate electrode. Thereafter, dopant ions are implanted using the polysilicon electrode 206 as a mask, thereby forming the first and second n-type diffusion layers 207a and 207b. And then the same process steps as those of the third embodiment are performed to form the interlevel dielectric film 208, the contact holes 209, the tungsten plugs 210 and the first and second aluminum interconnects 211a and 211b.

In the third embodiment, the dot elements 204 constituting the floating gate are formed substantially uniformly over the entire region interposed between the polysilicon electrode 206 and the p-type Si substrate 201. However, in the case of using CHE's for writing, a larger number of CHE's are generated in the vicinity of an end of the drain just under the polysilicon electrode 206. Thus, the dot elements 204, constituting the floating gate, are only required to exist over a region to be the drain during writing. Accordingly, if the dot elements 204 to be the floating gate are formed only over the end of the first n-type diffusion layer 207a and voltages are set such that the first n-type diffusion layer 207a functions as the drain during writing, a write operation can be performed efficiently. That is to say, in the same way as in the write operation of the third embodiment using CHE's, the second aluminum interconnect 211b and the p-type Si substrate 201 are grounded, an appropriate positive voltage is applied to the first aluminum interconnect 211a and the voltage in the polysilicon electrode 206 is controlled at a value where CHE's are more likely to be generated.

By employing such a memory cell structure and such a write operation, the number of dot elements 204 required to constitute the floating gate can be reduced. Accordingly, the number of electrons to be injected by using the CHE's can also be reduced. As a result, power consumption can be reduced and a write speed can be increased.

On the other hand, it is when the dot elements 204 exist in the vicinity of one end of the source under the polysilicon electrode 206 that the threshold value of the transistor is changed most effectively with the existence/absence of charges in the dot elements 204 to constitute the floating gate. Accordingly, in performing a read operation on the memory cell shown in FIG. 8, the potential level relationship between the first and second n-type diffusion layers 207a and 207b are inverted compared to the case of writing such that the first and second n-type diffusion layers 207a and 207b function as source and drain, respectively. As a result, the read performance can be further improved. In order to realize such a relationship, the first aluminum interconnect 211a and the p-type Si substrate 201 are grounded, the second aluminum interconnect 211b is allowed to be floating and an appropriate voltage is applied to the polysilicon electrode 206 as in the read operation of the third embodiment.

Alternatively, the first and second n-type diffusion layers 207a and 207b may also function as drain and source, respectively, during a read operation. In such a case, the second aluminum interconnect 211b and the p-type Si substrate 201 are grounded, the first aluminum interconnect 211a is allowed to be floating and an appropriate voltage is applied to the polysilicon electrode 206 in an opposite manner to the read operation of the third embodiment.

In an erase operation of this embodiment, Fowler-Nordheim (FN) current flowing through the oxide film or direct tunneling current may also be used. In such a case, a negative voltage, which polarity is described with respect to the p-type Si substrate 201 or the first n-type diffusion layer 207a, is applied to the polysilicon electrode 206. Then, the electrons stored in the dot elements 204 as a floating gate are tunneled through the gate oxide film 203 to move into the p-type Si substrate 201 or the first n-type diffusion layer 207a. As a result, data is erased.

Thus, in the memory cell of this embodiment, information can be written, read out or erased even more effectively depending on the type or application of the semiconductor memory device by locating the dot elements 204 as a floating gate at a desired position between the source and the drain.

In this embodiment, the substrate is made of p-type silicon. Alternatively, an n-type Si substrate may be used.

Furthermore, a substrate made of a compound semiconductor such as GaAs or any other semiconductor may also be used.

Also, any fine particles other than Si, Au, Fe fine particles may also be used for the dot elements. For example, semiconductor fine particles other than Si fine particles or metal, semiconductor or semi-insulating fine particles such as Ti and GaAs fine particles having a function of storing charges may also be used.

EMBODIMENT 5

Figure 9:
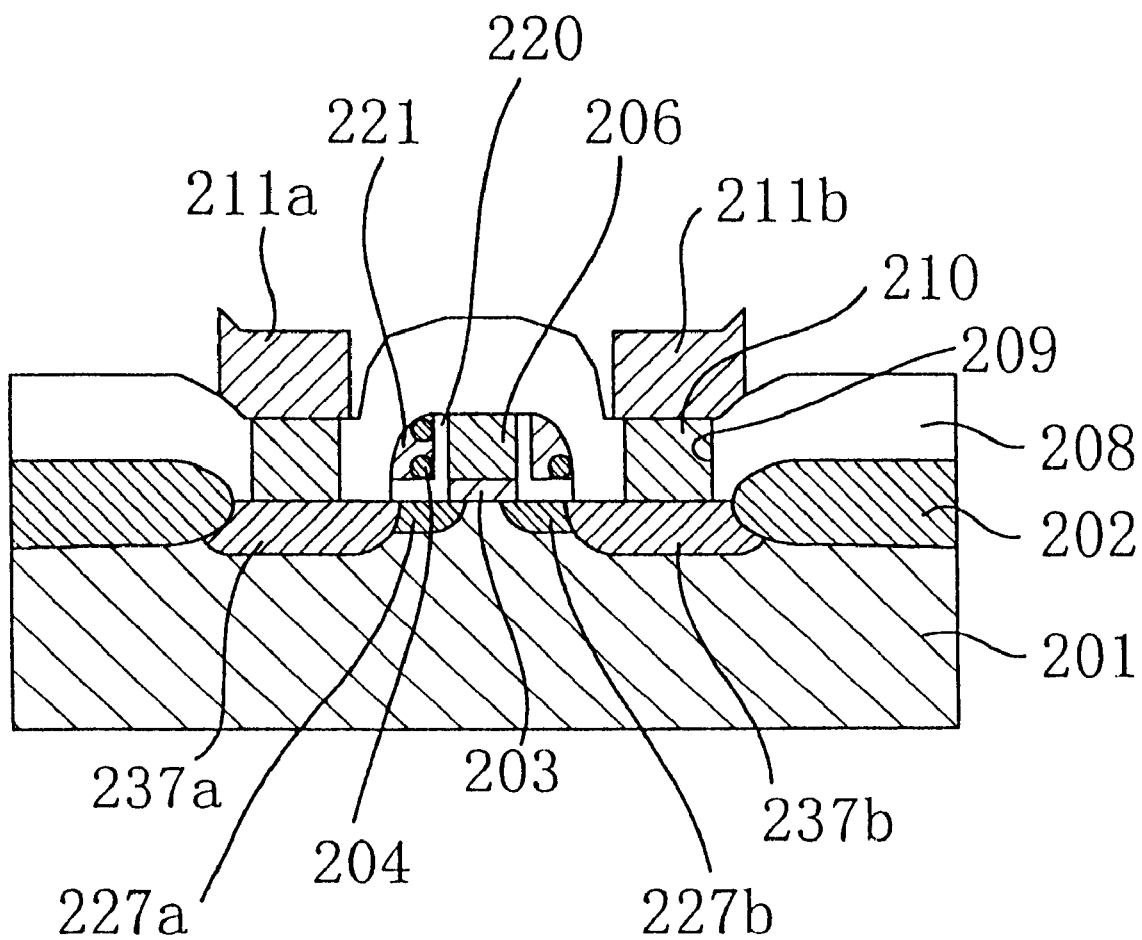
FIG. 9 is a cross-sectional view of a nonvolatile memory cell of the fifth embodiment, in which dot elements are formed only in a sidewall oxide film on both sides in accordance with the method of the present invention.

Next, the fifth embodiment of the present invention, in which dot elements are buried in a sidewall insulating film of the control gate electrode, will be described. FIG. 9 is a cross-sectional view illustrating the structure of a nonvolatile memory cell in the fifth embodiment. In FIG. 9, the components having the same structures as the counterparts in FIG. 6 are identified by the same reference numerals, and the structures and functions thereof are just as already described.

As shown in FIG. 9, the polysilicon electrode 206 to be a control gate electrode is formed over the p-type Si substrate 201 with the gate oxide film 203 interposed therebetween. A covering oxide film 220 is formed to extend from the side faces of the polysilicon electrode 206 to the surface of the substrate. Over the side faces of the polysilicon electrode 206, a sidewall oxide film 221 and the dot elements 204 to be the floating gate are formed with the covering oxide film 220 interposed therebetween. The dot elements 204 are covered with the sidewall oxide film 221. Part of the covering oxide film 220, which is not in contact with the polysilicon electrode 206 but located between the dot elements 204 and the p-type Si substrate 201, functions as a tunnel insulating film. In the p-type Si substrate 201, the first and second n-type diffusion layers 207a and 207b of the third and fourth embodiments are not formed. Instead, first and second n-type lightly doped layers 227a and 227b, each reaching the vicinity of an end of the polysilicon electrode 206, and first and second n-type heavily doped layers 237a and 237b, each reaching the vicinity of an outer end of the sidewall oxide film 221, are formed. That is to say, the substrate has a so-called "LDD" structure.

Such a structure can be easily formed by performing the process steps shown in FIGS. 10(a) through 10(d).

Figure 10A:
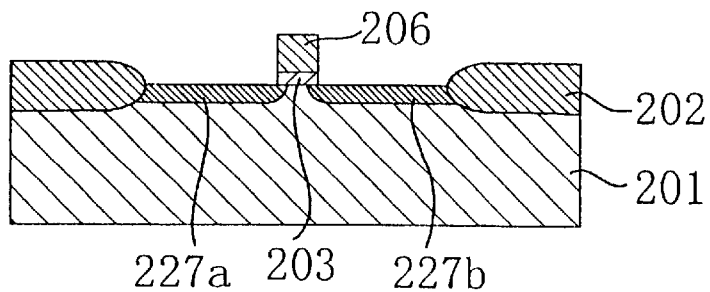
FIGS. 10(a) through 10(d) are cross-sectional views illustrating respective process steps for fabricating a memory cell in the fifth embodiment.

First, in the step shown in FIG. 10(a), the gate oxide film 203 and the polysilicon electrode 206 are formed over the p-type Si substrate 201. Then, n-type dopant ions (e.g., arsenic ions) are implanted by using these as a mask, thereby forming the first and second n-type lightly doped layers 227a and 227b.

Figure 10B:
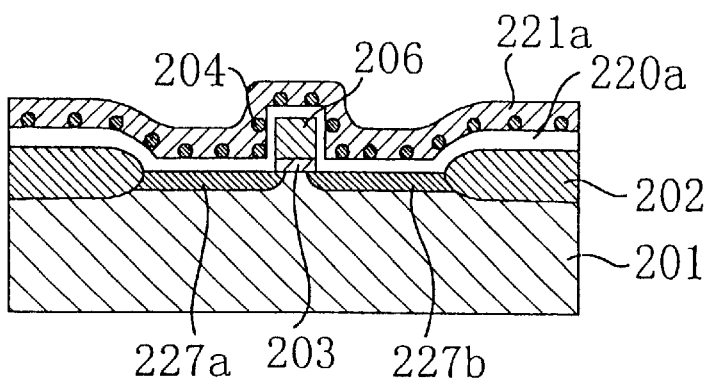

Next, in the step shown in FIG. 10(b), the upper surface of the p-type Si substrate 201 and the side faces of the polysilicon electrode 206 are oxidized to form a silicon dioxide film 220a to be the covering oxide film 220. Thereafter, the dot elements 204 to be the floating gate are formed over the entire silicon dioxide film 220a in accordance with the method of the first or second embodiment. Furthermore, another silicon dioxide film 221a is deposited by a CVD technique over the substrate, thereby filling in the gaps of the dot elements 204 with silicon dioxide as an insulator.

Subsequently, in the step shown in FIG. 10(c), the two silicon dioxide films 221a and 220a are etched anisotropically, thereby forming the covering oxide film 220 and the sidewall oxide film 221 around the polysilicon electrode 206 to be the control gate electrode. Thereafter, n-type dopant ions (e.g., arsenic ions) are implanted at a high doping level using the polysilicon electrode 206 and the sidewall oxide film 221 as a mask, thereby forming the first and second n-type heavily doped layers 237a and 237b.

Figure 10C:
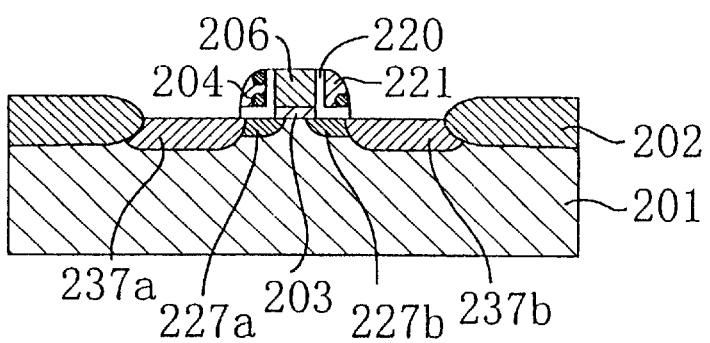
Figure 10D:
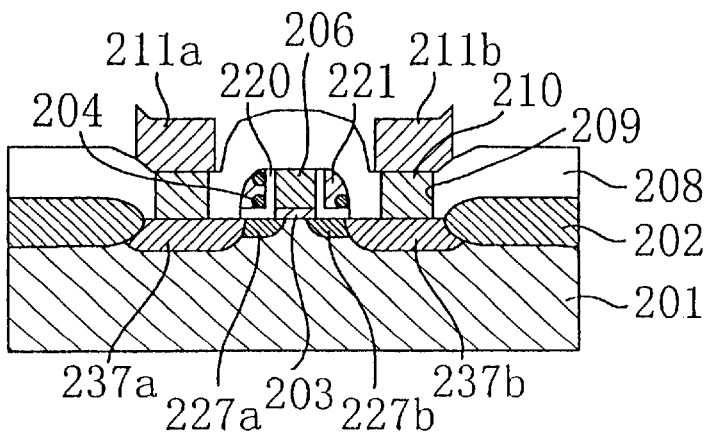

Finally, in the step shown in FIG. 10(d), an interlevel dielectric film 208 is formed. Contact holes 209 are opened in the interlevel dielectric film 208. The tungsten plugs 210 are formed by filling in the contact holes 209 with tungsten. And the first and second aluminum interconnects 211a and 211b are formed. All of these parts may be formed by known techniques.

It is noted that in the anisotropic etching between the process steps shown in FIGS. 10(b) and 10(c), only the upper silicon dioxide film 221a may be removed and the lower silicon dioxide film 220a may be left. In such a case, the dot elements 204 remain on the lower silicon dioxide film 220a. However, if only the exposed dot elements 204 are selectively etched (using an acid, for example), then the sidewall oxide film 221 covering the dot elements 204 can be formed over the side faces of the polysilicon electrode 206 while removing the exposed dot elements 204.

While the nonvolatile memory cell of this embodiment performs a write, read or erase operation, the voltages are set as described in the third embodiment.

In the nonvolatile memory cell of this embodiment, the dot elements 204 to be the floating gate can be formed to be self-aligned with the side faces of the polysilicon electrode 206 as a control gate by etching the two silicon dioxide films 220a and 221a anisotropically. Thus, this structure is suitable for miniaturization.

Moreover, the first and second n-type heavily doped layers 237a and 237b can be formed in a self-aligned manner by using the sidewall oxide film 221 provided for protecting the dot elements 204. Accordingly, an LDD structure, suitable for miniaturization and advantageous to the suppression of short channel effects, can be obtained.

Only the gate oxide film 203 exists between the polysilicon electrode 206 functioning as a control gate and the p-type Si substrate 201 functioning as a channel. In such a case, no tunneling current needs to be supplied through the gate oxide film 203. Thus, the memory transistor of this embodiment may have the same structure and performance as those of a transistor used for an ordinary logical device.

On the other hand, the dot elements 204 to be the floating gate face the first and second n-type lightly doped layers 227a and 227b vertically and the polysilicon electrode 206 horizontally through the covering oxide film 220. Assume the polysilicon electrode 206 is made of polysilicon doped with a dopant such as phosphorus at a high level. Then, during the oxidation process step for forming the covering oxide film 220, the polysilicon electrode 206 is oxidized about three times faster than the n-type lightly doped layer 227a. Accordingly, the thickness of the covering oxide film 220 becomes about three times larger on the side faces of the polysilicon electrode 206 than on the first and second n-type lightly doped layers 227a and 227b. Thus, while charges are stored in the dot elements 204 by using CHE's during writing, it is possible to prevent the charges, which have reached the dot elements 204, from being laterally tunneled through the covering oxide film 220 to reach the polysilicon electrode 206. And at the same time, charges can be easily tunneled through the thin covering oxide film 220 over the first and second n-type lightly doped layers 227a and 227b and injected into the dot elements 204.

In this embodiment, the substrate is made of p-type silicon. Alternatively, an n-type Si substrate may be used. Furthermore, a substrate made of a compound semiconductor such as GaAs or any other semiconductor may also be used.

Also, any fine particles other than Si, Au, Fe fine particles may also be used for the dot elements. For example, semiconductor fine particles other than Si fine particles or metal, semiconductor or semi-insulating fine particles such as Ti and GaAs fine particles having a function of storing charges may also be used.

EMBODIMENT 6

Figure 11:
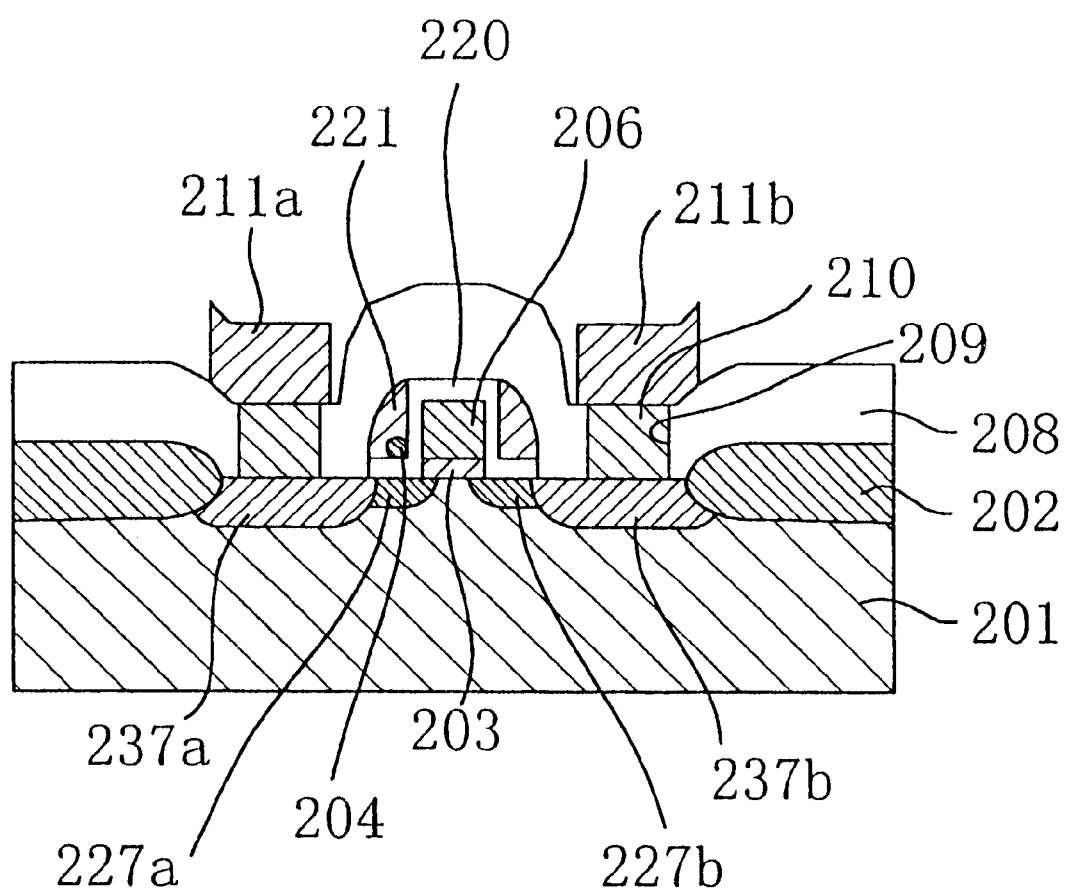
FIG. 11 is a cross-sectional view of a nonvolatile memory cell of the sixth embodiment, in which dot elements are formed only in a sidewall oxide film on either one side in accordance with the method of the present invention.

Next, the sixth embodiment of the present invention, in which dot elements are buried in a sidewall insulating film of the control gate electrode, will be described. FIG. 11 is a cross-sectional view illustrating the structure of a nonvolatile memory cell in the sixth embodiment. In FIG. 11, the components having the same structures as the counterparts in FIG. 6 are identified by the same reference numerals, and the structures and functions thereof are just as already described.

As shown in FIG. 11, the polysilicon electrode 206 to be a control gate electrode is formed over the p-type Si substrate 201 with the gate oxide film 203 interposed therebetween. A covering oxide film 220 is formed to entirely surround the polysilicon electrode 206 and reach the surface of the substrate. Over the side faces of the polysilicon electrode 206, a sidewall oxide film 221 is formed with the covering oxide film 220 interposed therebetween. The dot elements 204 to be the floating gate are formed in the sidewall insulating film 221 on the covering oxide film 220. Part of the covering oxide film 220, which is not in contact with the polysilicon electrode 206 but located between the dot elements 204 and the p-type Si substrate 201, functions as a tunnel insulating film. In the p-type Si substrate 201, the first and second n-type diffusion layers 207a and 207b of the third and fourth embodiments are not formed. Instead, first and second n-type lightly doped layers 227a and 227b, each reaching the vicinity of an end of the polysilicon electrode 206, and first and second n-type heavily doped layers 237a and 237b, each reaching the vicinity of an outer end of the sidewall oxide film 221, are formed. That is to say, the substrate has a so-called "LDD" structure.

Such a structure can be easily formed by performing the following process steps. First, the gate oxide film 203 and the polysilicon electrode 206 are formed over the p-type Si substrate 201. Then, dopant ions are implanted by using these as a mask, thereby forming the first and second n-type lightly doped layers 227a and 227b. Next, the upper surface of the p-type Si substrate 201 and the side faces of the polysilicon electrode 206 are oxidized to form the covering oxide film 220. Thereafter, the dot elements 204 to be the floating gate are formed only over one end of the first n-type lightly doped layer 227a in accordance with the method of the first embodiment. Furthermore, a silicon dioxide film or the like is deposited over the substrate, thereby filling in the gaps of the dot elements 204 with an insulator. Subsequently, the silicon dioxide film is etched anisotropically, thereby forming the sidewall oxide film 221.

Thereafter, dopant ions are implanted at a high doping level using the sidewall oxide film 221 as a mask, thereby forming the first and second n-type heavily doped layers 237a and 237b.

While the nonvolatile memory cell of this embodiment per forms a write, read or erase operation, the voltages are set as described in the fourth embodiment.

In the nonvolatile memory cell of this embodiment, the same effects as those attained by the fourth embodiment can also be attained. In addition, the dot elements 204 functioning as the floating gate can be formed to be self-aligned with the polysilicon electrode 206 functioning as a control gate. Moreover, the first n-type lightly doped layer 227a is formed to be self-aligned with the polysilicon electrode 206 and the first n-type heavily doped layer 237a is formed to be self-aligned with the sidewall oxide film 221. Thus, the respective layers 227a and 237a can be regarded as being self-aligned with the dot elements 204. As can be understood, the dot elements can be located to be self-aligned with a desired region between the drain and the source in the memory cell of this embodiment. Accordingly, information can be written, read out or erased even more effectively depending on the type or application of the semiconductor memory device.

Furthermore, the first and second n-type heavily doped layers 237a and 237b can be formed in a self-aligned manner by using the sidewall oxide film 221 provided for protecting the dot elements 204. Accordingly, an LDD structure, suitable for miniaturization and advantageous to the suppression of short channel effects, can be obtained. Also, compared with the third embodiment, relative positional accuracy between the dot elements 204 to be the floating gate and the first n-type heavily doped layer 237a can be improved.

Only the gate oxide film 203 exists between the polysilicon electrode 206 functioning as a control gate and the p-type Si substrate 201 functioning as a channel. In such a case, no tunneling current needs to be supplied through the gate oxide film 203. Thus, the memory transistor of this embodiment may have the same structure and performance as those of a transistor used for an ordinary logical device.

On the other hand, the dot elements 204 to be the floating gate face the first n-type lightly doped layer 227a vertically and the polysilicon electrode 206 horizontally through the covering oxide film 220. Assume the polysilicon electrode 206 is made of polysilicon doped with a dopant such as phosphorus at a high level. Then, during the oxidation process step for forming the covering oxide film 220, the polysilicon electrode 206 is oxidized about three times faster than the n-type lightly doped layer 227a. Accordingly, the thickness of the covering oxide film 220 becomes about three times larger around the polysilicon electrode 206 than on the first n-type lightly doped layer 227a. Thus, while charges are stored in the dot elements 204 by using CHE's during writing, it is possible to prevent the charges, which have reached the dot elements 204, from being laterally tunneled through the covering oxide film 220 to reach the polysilicon electrode 206. And at the same time, charges can be easily tunneled through the thin covering oxide film 220 over the first n-type lightly doped layer 227a and injected into the dot elements 204.

In this embodiment, the substrate is made of p-type silicon. Alternatively, an n-type Si substrate may be used. Furthermore, a substrate made of a compound semiconductor such as GaAs or any other semiconductor may also be used.

Also, any fine particles other than Si, Au, Fe fine particles may also be used as the dot elements. For example, semiconductor fine particles other than Si fine particles or metal, semiconductor or semi-insulating fine particles such as Ti and GaAs fine particles having a function of storing charges may also be used.

EMBODIMENT 7

Figure 12:
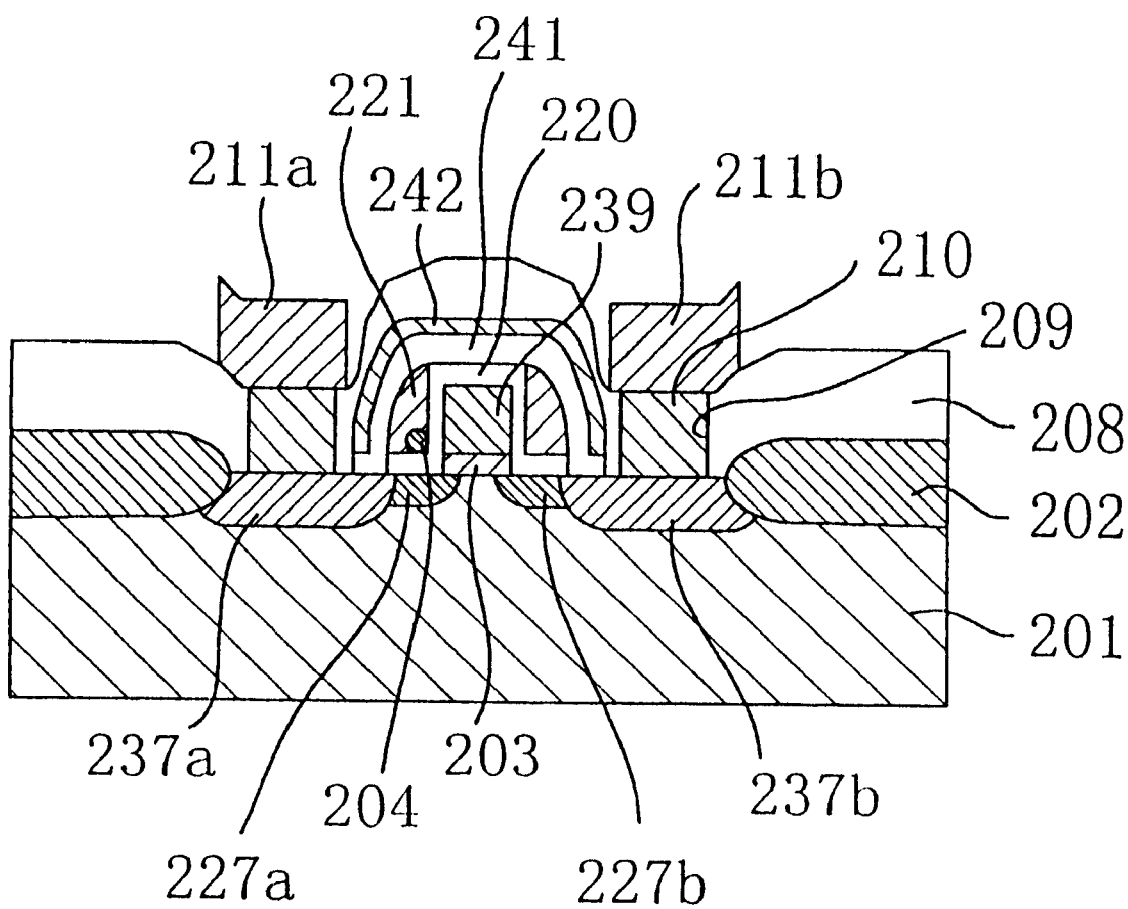
FIG. 12 is a cross-sectional view of a nonvolatile memory cell of the seventh embodiment, in which dot elements are formed only in a sidewall oxide film on either one side in accordance with the method of the present invention.

Next, the seventh embodiment of the present invention, in which dot elements are buried in a sidewall insulating film of a select gate electrode, will be described. FIG. 12 is a cross-sectional view illustrating the structure of a nonvolatile memory cell in the seventh embodiment. In FIG. 12, the components having the same structures as the counterparts in FIG. 11 are identified by the same reference numerals, and the structures and functions thereof are just as already described.

As shown in FIG. 12, a polysilicon electrode 239 is formed over the p-type Si substrate 201 with the gate oxide film 203 interposed therebetween. This polysilicon electrode 239 functions as a select gate electrode, not a control gate electrode. A covering oxide film 220 is formed to entirely surround the polysilicon electrode 239 and reach the surface of the substrate. Over the side faces of the polysilicon electrode 239, a sidewall oxide film 221 is formed with the covering oxide film 220 interposed therebetween. The dot elements 204 to be the floating gate are formed in the sidewall insulating film 221 on the covering oxide film 220. A control gate electrode 242 is further formed to be capacitively coupled to the dot elements 204 with an interelectrode insulating film 241 interposed therebetween. The structures of the other parts are the same as those in the sixth embodiment.

Such a structure can be easily formed by performing the process steps of forming the interelectrode insulating film 241 and the control gate electrode 242 in addition to the fabrication process steps of the sixth embodiment. Thus, the detailed description thereof will be omitted herein.

In this embodiment, the select gate electrode 239, i.e., a select transistor, is formed. Thus, not only the effects of the sixth embodiment can also be attained, but also a highly reliable nonvolatile memory cell, which can be driven with lower power consumption and at a lower voltage, can be obtained.

In this embodiment, the substrate is made of p-type silicon. Alternatively, an n-type Si substrate may be used. Furthermore, a substrate made of a compound semiconductor such as GaAs or any other semiconductor may also be used.

Also, any fine particles other than Si, Au, Fe fine particles may also be used as the dot elements. For example, semiconductor fine particles other than Si fine particles or metal, semiconductor or semi-insulating fine particles such as Ti and GaAs fine particles having a function of storing charges may also be used.

EMBODIMENT 8

Figure 13:
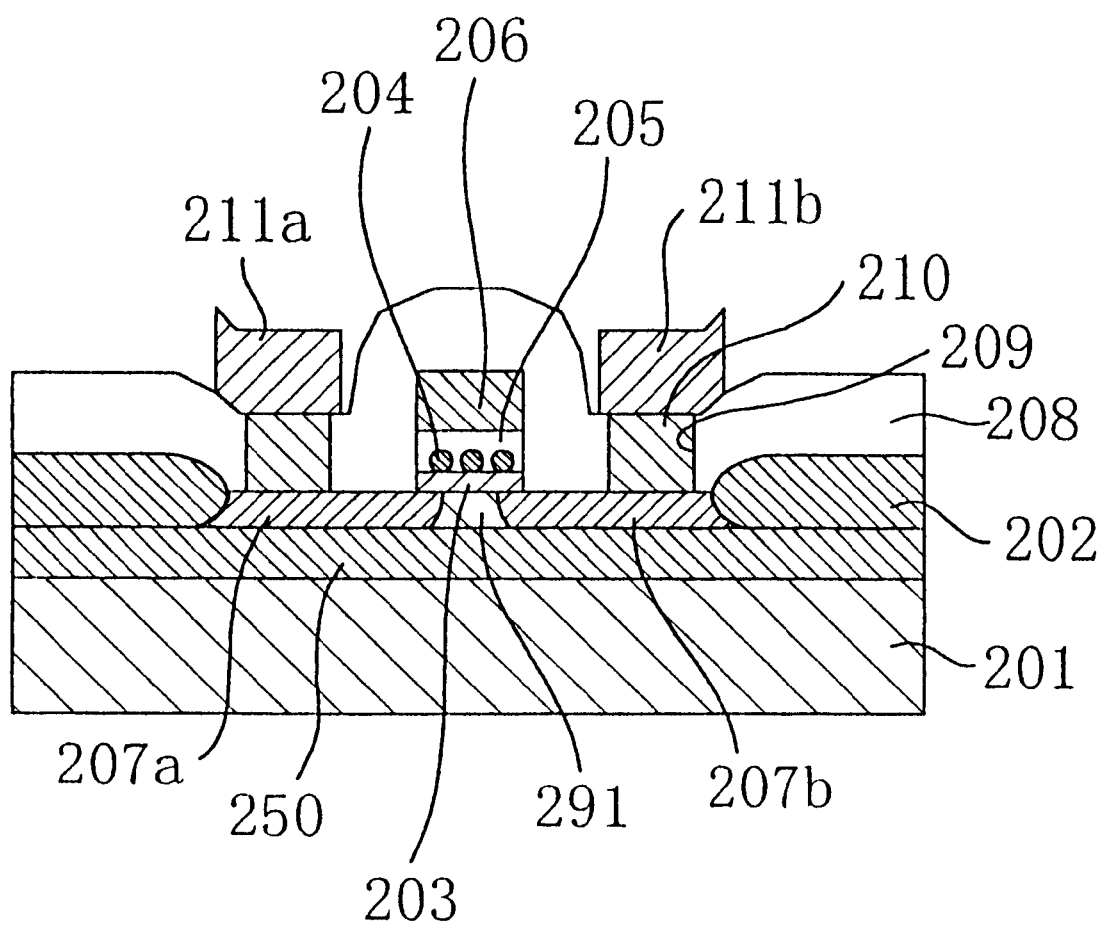
FIG. 13 is a cross-sectional view of a nonvolatile memory cell of the eighth embodiment, in which dot elements are formed over an SOI substrate in accordance with the method of the present invention.

Next, the eighth embodiment of the present invention, in which an SOI substrate is used instead of the Si substrate, will be described. FIG. 13 is a cross-sectional view illustrating the structure of a nonvolatile memory cell in the eighth embodiment. In FIG. 13, the components having the same structures as the counterparts in FIG. 6 are identified by the same reference numerals, and the structures and functions thereof are just as already described.

As shown in FIG. 13, a buried oxide layer 250 is formed in this embodiment in a surface region of the p-type Si substrate 201 to reach a predetermined depth. And on the buried oxide layer 250, the first and second n-type diffusion layers 207a and 207b and a channel region 291 interposed therebetween are formed. The structures of the other parts are the same as those shown in FIG. 6.

In this embodiment, the write, read and erase operations are performed in fundamentally the same way as in the third embodiment. In this embodiment in particular, since the potential in the channel region 291 of each nonvolatile memory cell can be controlled, the write, read and erase operations may be advantageously performed more accurately and more rapidly.

In this embodiment, the substrate is made of p-type silicon. Alternatively, an n-type Si substrate may be used.

Also, any fine particles other than Si, Au, Fe fine particles may also be used for the dot elements. For example, semiconductor fine particles other than Si fine particles or metal, semiconductor or semi-insulating fine particles such as Ti and GaAs fine particles having a function of storing charges may also be used.

In the memory cell structures of the foregoing fourth to seventh embodiments and the ninth embodiment to be described below, a buried oxide layer may also be formed in a surface region of the p-type Si substrate 201 to reach a predetermined depth. And a channel region may also be formed between these two layers on the buried oxide layer.

EMBODIMENT 9

Figure 14:
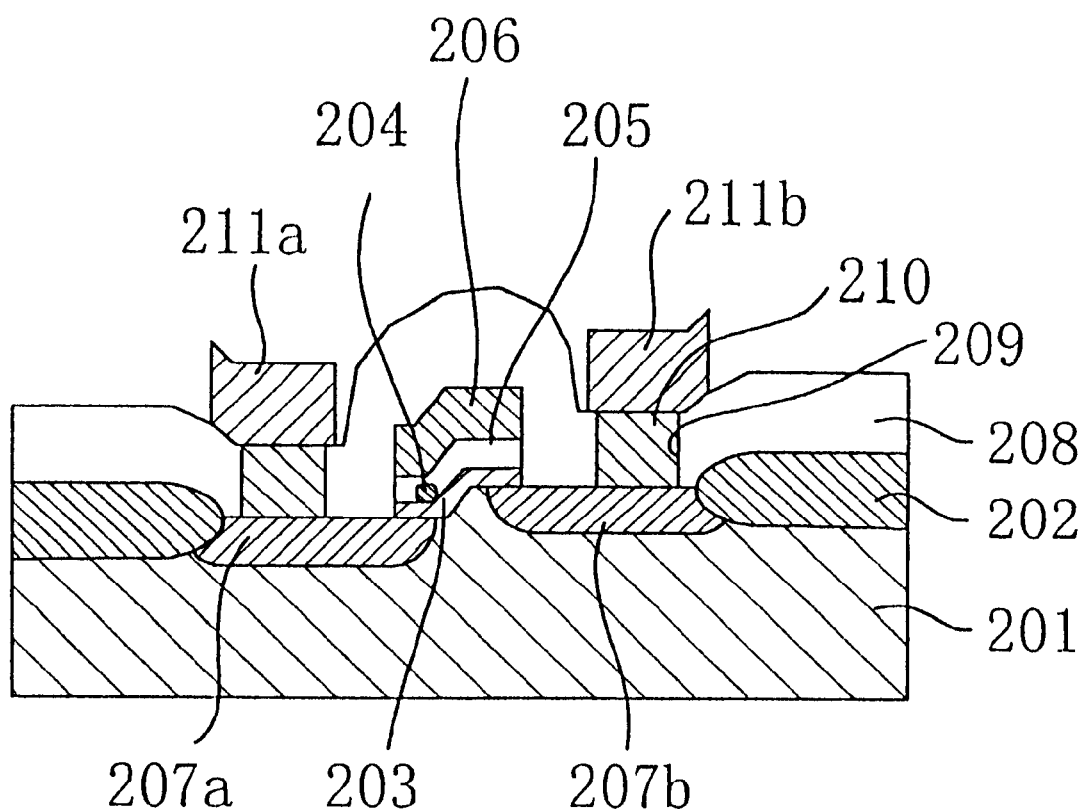
FIG. 14 is a cross-sectional view of a nonvolatile memory cell of the ninth embodiment, in which dot elements are formed only on a lower-level portion of an oxide film overlapping an inclined portion in accordance with the method of the present invention.

Next, the ninth embodiment of the present invention, in which the dot elements are formed on a lower-level portion of a gate insulating film having an inclined portion, will be described. FIG. 14 is a cross-sectional view illustrating the structure of a nonvolatile memory cell in the ninth embodiment. In FIG. 14, the components having the same structures as the counterparts in FIG. 8 are identified by the same reference numerals, and the structures and functions thereof are just as already described.

As shown in FIG. 14, an inclined portion is provided in the upper surface of the p-type Si substrate 201 in this embodiment. The gate oxide film 203, the silicon dioxide film 205 and the polysilicon electrode 206 functioning as a control gate electrode are formed so as to overlap the inclined portion and the regions on right- and left-hand sides thereof. And the dot elements 204 to be the floating gate are formed only on the lower-level portion of the gate oxide film 203 (i.e., the left-hand part of the hatched gate oxide film 203) in the vicinity of one end of the first n-type diffusion layer 207a.

Such a structure can be easily formed by performing the step of forming the inclined portion in the p-type Si substrate 201 in addition to the fabrication process steps of the fourth embodiment, and thus the description thereof will be omitted herein. The inclined portion may be formed in the p-type Si substrate 201 by crystalline anisotropic etching (e.g., using an aqueous solution of ethylenediamine and catechol) for aligning the edge of the substrate to a particular plane orientation, for example.

The nonvolatile memory cell of this embodiment performs the write, read and erase operations. in fundamentally the same way as in the fourth embodiment.

In this embodiment, not only the effects of the fourth embodiment, but also the following effects can be attained.

In the case of using CHE's for writing, in the memory cell structures shown in FIGS. 6 and 8, the direction of the CHE's moving from the second to the first n-type diffusion layer 207b to 207a in the channel formed in the p-type Si substrate 201 is ordinarily vertical to the direction of the CHE's passing through the gate oxide film 203 and being injected into the dot elements 204. Thus, the injection probability of the CHE's is very low. However, in the structure shown in FIG. 14, the channel is inclined. Thus, the angle formed between the direction of the CHE's moving from the second to the first n-type diffusion layer 207b to 207a in the channel and the direction of the CHE's passing through the gate oxide film 203 and being injected into the dot elements 204 is less than 90 degrees. As a result, the injection probability of CHE's is increased. Consequently, power consumption can be reduced and write speed can, be increased.

In this embodiment, the substrate is made of p-type silicon. Alternatively, an n-type Si substrate may be used. Furthermore, an SOI substrate formed by epitaxially growing an Si layer on an insulating substrate may be naturally used.

Also, any fine particles other than Si, Au, Fe fine particles may also be used as the dot elements. For example, semiconductor fine particles other than Si fine particles or metal, semiconductor or semi-insulating fine particles such as Ti and GaAs fine particles having a function of storing charges may also be used.

EMBODIMENT 10

Figure 15:
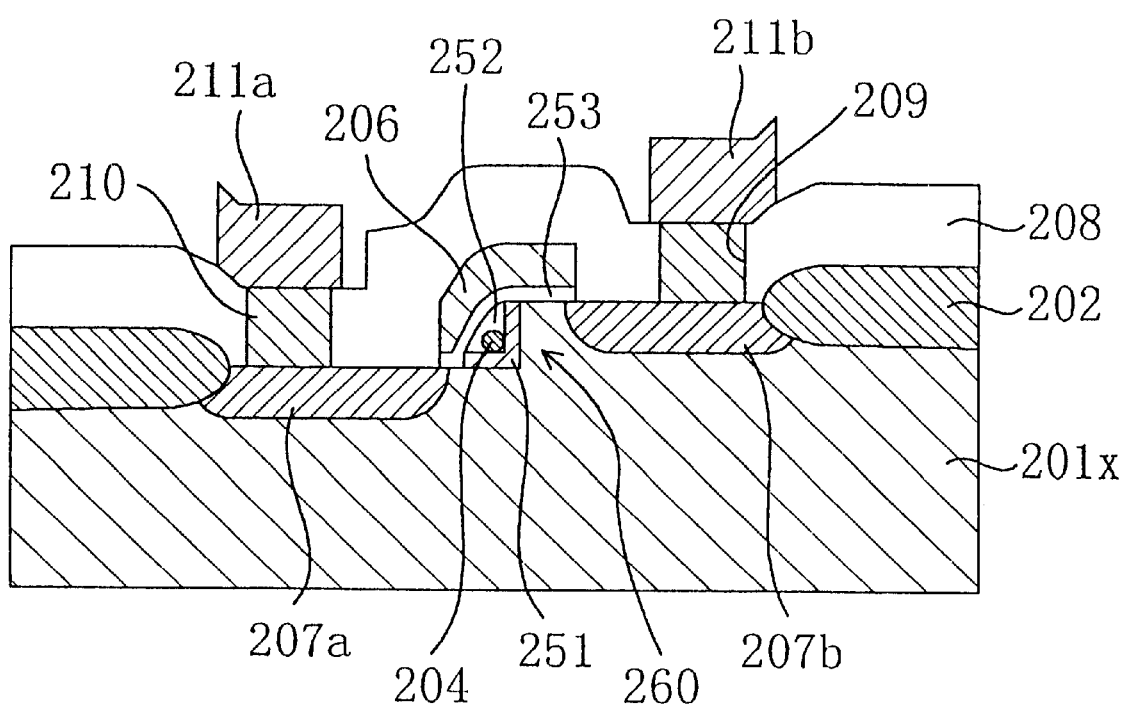
FIG. 15 is a cross-sectional view of a nonvolatile memory cell of the tenth embodiment, in which dot elements are formed only on a corner portion of a stepped portion in accordance with the method of the present invention.

Next, the tenth embodiment of the present invention, in which the dot elements are formed on a corner portion of a gate insulating film having a stepped portion, will be described. FIG. 15 is a cross-sectional view illustrating the structure of a nonvolatile memory cell in the tenth embodiment.

As shown in FIG. 15, in the memory cell of this embodiment, a stepped portion 260, the side face of which is a $\{100\}$ plane, is formed in a p-type Si substrate 201x, the principal surface of which is a $\{111\}$ plane. A first gate oxide film 251, a sidewall oxide film 252, a second gate oxide film 253 and a polysilicon electrode 206 functioning as a control gate electrode are formed in this order so as to overlap the stepped portion 260 and right- and left-hand side regions thereof. And the dot elements 204 functioning as a floating gate are formed only on the corner portion of the first gate oxide film 251 so as to be located in the vicinity of one end of the first n-type diffusion layer 207a. In this case, the first gate oxide film 251 is relatively thick on the $\{111\}$ plane, in which Si single crystals are most densely arranged, and is relatively thin on the side face of the stepped portion 260, which is a $\{100\}$ plane. The thickness of the second gate oxide film 253 is almost as large as that of the first gate oxide film 251 at the relatively thick portion thereof.

Figure 16A:
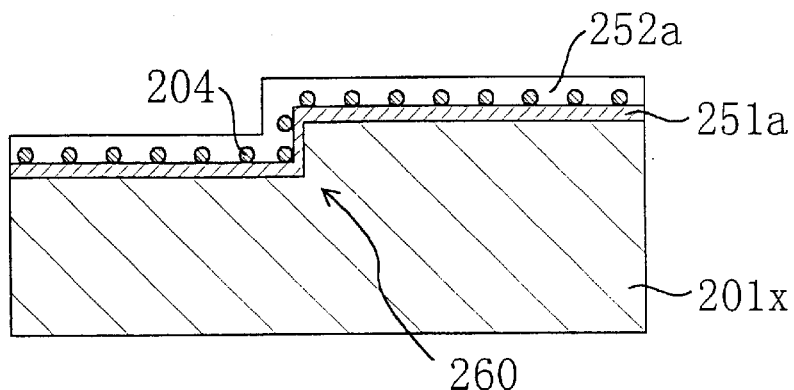
FIGS. 16(a) through 16(c) are cross-sectional views illustrating respective process steps for fabricating a nonvolatile memory cell in the tenth embodiment.
Figure 16B:
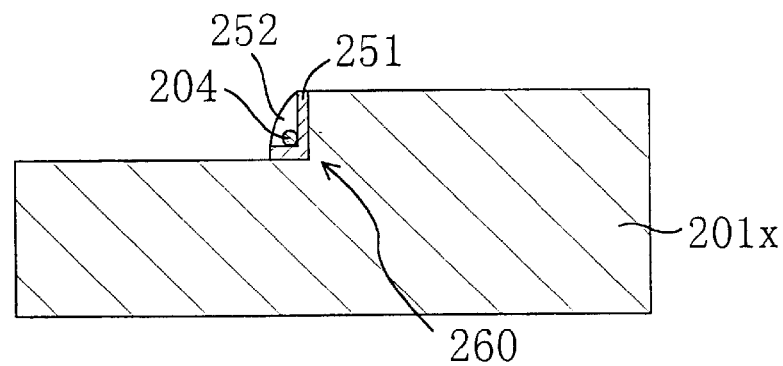
Figure 16C:
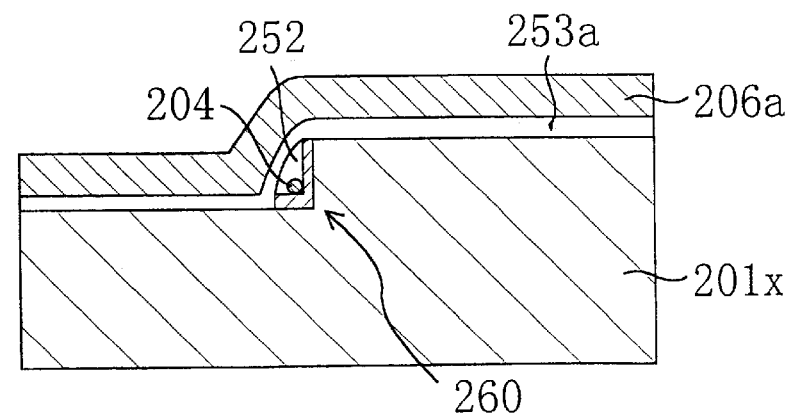

Such a structure can be easily formed by performing the process steps shown in FIGS. 16(a) through 16(c).

First, in the step shown in FIG. 16(a), the p-type Si substrate 201x, the principal surface of which is a $\{111\}$ plane, is prepared. And the stepped portion 260, the side face of which is a $\{100\}$ plane, is formed in the active region of the p-type Si substrate 201x. The stepped portion 260 may be formed in the p-type Si substrate 201x by crystalline anisotropic etching (e.g., using an aqueous solution of ethylenediamine and catechol) for aligning the edge of the substrate to a particular plane orientation, for example.

Then, a silicon dioxide film 251a to be a gate oxide film is formed on the substrate by thermal oxidation. In this case, the oxide film is formed to be relatively thick on the principal surface, because the principal surface is the densest $\{111\}$ plane. On the other hand, since the side face of the stepped portion 260 is a $\{100\}$ plane where the density of Si atoms is low, the oxide film formed thereon becomes relatively thin. That is to say, the silicon dioxide film 251a, which is thick on the principal surface of the substrate but thin on the side face of the stepped portion 260, is obtained. Thereafter, in accordance with the method of the first or second embodiment, the dot elements 204, to constitute a floating gate, are formed over the entire surface of the substrate. Furthermore, another silicon dioxide film 252a is deposited over the substrate by a CVD technique, thereby filling in the gaps of the dot elements 204 with an insulator.

Next, in the step shown in FIG. 16(b), the two silicon dioxide film 251a and 252a are etched anisotropically, thereby forming the first gate oxide film 251 and the sidewall oxide film 252 around the polysilicon electrode 206 to be a control gate electrode. In this process step, the lower-level silicon dioxide film 251a is entirely removed except for the portion on the side face of the stepped portion 260 and on the surrounding regions thereof. Thus, the dot elements 204, which existed on the removed portion of the silicon dioxide film 251a, are also removed simultaneously.

Thereafter, in the step shown in FIG. 16(c), another silicon dioxide film 253a to be the second gate oxide film, and a polysilicon film 206a to be the polysilicon electrode are deposited in this order by a CVD technique.

In the subsequent process steps (not shown), the polysilicon film 206a and the silicon dioxide film 253a are patterned, thereby forming the polysilicon electrode 206 functioning as a control gate electrode and the second gate oxide film 253. Then, n-type dopant ions (such as arsenic ions) are implanted at a high doping level by using the polysilicon electrode 206 as a mask to form n-type diffusion layers 237a and 237b. Thereafter, an interlevel dielectric film 208 is formed. Contact holes 209 are opened in the interlevel dielectric film 208. Tungsten plugs 210 are formed by filling in the contact holes 209 with tungsten. And the first and second aluminum interconnects 211a and 211b are formed. All of these parts may be formed by known techniques. As a result, the memory cell structure shown in FIG. 15 is obtained.

It is noted that in the anisotropic etching between the process steps shown in FIGS. 16(a) and 16(b), only the upper-level silicon dioxide film 252a may be removed and the lower-level silicon dioxide film 251a may be left. In such a case, the dot elements 204 remain on the lower-level silicon dioxide film 251a. However, if only the exposed dot elements 204 are selectively etched (using an acid, for example), then the sidewall oxide film 252 covering the dot elements 204 can be formed on the side face of the polysilicon electrode 206 while removing the exposed dot elements 204.

The nonvolatile memory cell of this embodiment performs the write, read and erase operations in fundamentally the same way as in the ninth embodiment.

In this embodiment, not only the effects of the ninth embodiment, but also the following effects can be attained.

In the case of using CHE's for writing, in the structure shown in FIG. 15 having a stepped channel, the direction of CHE's moving from the second to the first n-type diffusion layer 207b to 207a in the channel is substantially parallel to the direction of CHE's passing through the first gate oxide film 251 and being injected into the dot elements 204. Thus, the injection probability of CHE's can be even more increased. In addition, since the first gate oxide film 251 is relatively thin on the side face of the stepped portion 260, which is a {100} plane, the injection probability of CHE's can be increased noticeably. Consequently, power consumption can be remarkably reduced and write speed can be tremendously increased.

In this embodiment, the substrate is made of p-type silicon. Alternatively, an n-type Si substrate may be used. Furthermore, an SOI substrate formed by epitaxially growing an Si layer on an insulating substrate may be naturally used.

Also, any fine particles other than Si, Au, Fe fine particles may also be used for the dot elements. For example, semiconductor fine particles other than Si fine particles or metal, semiconductor or semi-insulating fine particles such as Ti and GaAs fine particles having a function of storing charges may also be used.

If a single-layer protein film is formed to produce dot elements for the memory cell of the third, fifth, eighth, ninth or tenth embodiment, the dot elements may be formed in accordance with any method other than the method of the second embodiment. Also, instead of a single-layer protein film, a multilayer thin film may also be used.

What is claimed is:

1. A semiconductor device functioning as a nonvolatile memory cell, comprising:

a semiconductor substrate;

a tunnel insulating film, which is formed on the semiconductor substrate and has a such a thickness as to allow electrons to be tunneled therethrough;

dot elements, which are formed out of semiconductor or conductor fine particles on the tunnel insulating film and function as a floating gate;

a control gate for controlling the movement of electrons between the dot elements and the semiconductor substrate;

an interelectrode insulating film interposed between the dot elements and the control gate; and source/drain regions formed in the semiconductor substrate so as to sandwich the dot elements therebetween, wherein the dot elements are asymmetrically formed under the control gate to be closer to one of the source/drain regions.

2. The semiconductor device of claim 1, wherein the dot elements are formed under the control gate to be closer to a region functioning as a drain during writing.

3. The semiconductor device of claim 1, wherein the semiconductor substrate is an SOI substrate including an insulator layer under a semiconductor layer.

4. The semiconductor device of claim 1, wherein the dot elements are formed out of silicon fine particles.

5. The semiconductor device of claim 1, wherein the dot elements are formed out of metal fine particles.

6. A semiconductor device functioning as a nonvolatile memory cell, comprising:

a semiconductor substrate;

a tunnel insulating film which is formed on the semiconductor substrate and has such a thickness as to all electrons to be tunneled therethrough;

a control gate, formed over the semiconductor substrate with a gate insulating film interposed therebetween to control the movement of electrons between the dot elements and the semiconductor substrate;

an interelectrode insulating film interposed between the dot elements and the control gate;

source/drain regions formed in the semiconductor substrate so as to sandwich the dot elements therebetween;

a protective insulating film covering the side face of the control gate and including a part functioning as the interelectrode insulating film;

a sidewall insulating film formed over the side face of the control gate with the protective insulating film interposed therebetween; and dot elements formed out of semiconductor or conductor fine particles on the tunnel insulating film and functioning as a floating gate, said dot elements being buried in the sidewall insulating film so as to be located over the semiconductor substrate through the tunnel insulating film.

7. The semiconductor device of claim 6, wherein the dot elements are formed in only a part of the sidewall insulating film closer to the drain or source region.

8. A semiconductor device functioning as a nonvolatile memory cell comprising:

a semiconductor substrate;

a tunnel insulating film, which is formed on the semiconductor substrate and has such a thickness as to allow electrons to be tunneled therethrough;

a control gate for controlling the movement of electrons between the dot elements and the semiconductor substrate;

an interelectrode insulating film interposed between the dot elements and the control gate;

source/drain regions formed in the semiconductor substrate so as to sandwich the dot elements therebetween;

a select gate formed over the semiconductor substrate with a gate insulating film interposed therebetween;

a protective insulating film covering a side face of the select gate;

a sidewall insulating film formed over the side face of the select gate with the protective insulating film interposed therebetween;

dot elements formed out of semiconductor or conductor fine particles on the tunnel insulating film and functioning as a floating gate, said dot elements being buried in the sidewall insulating film so as to be located over the semiconductor substrate through the tunnel insulating film; and a control gate, formed so as to cover the sidewall insulating film through an interelectrode insulating film to control the movement of electrons between the dot elements and the semiconductor substrate.

9. A semiconductor device functioning as a nonvolatile memory cell comprising:

a semiconductor substrate;

a tunnel insulating film, which is formed on the semiconductor substrate and has such a thickness as to allow electrons to be tunneled therethrough;

a control gate for controlling the movement of electrons between the dot elements and the semiconductor substrate;

an interelectrode insulating film interposed between the dot elements and the control gate;

source/drain regions formed in the semiconductor substrate so as to sandwich the dot elements therebetween;

an inclined portion having a level difference said inclined portion being formed in a part of the principal surface of the semiconductor substrate;

a gate insulating film formed so as to overlap the inclined portion, dot elements formed out of semiconductor or conductor fine particles on the tunnel insulating film and functioning as a floating gate, said dot elements being formed on either a slope or a lower-level portion of the inclined portion, the lower-level portion being located adjacent to the slope.

10. A semiconductor device functioning as a nonvolatile memory cell comprising:

a semiconductor substrate;

a tunnel insulating film, which is formed on the semiconductor substrate and has such a thickness as to allow electrons to be tunneled therethrough;

a control gate for controlling the movement of electrons between the dot elements and the semiconductor substrate;

an interelectrode insulating film interposed between the dot elements and the control gate;

source/drain regions formed in the semiconductor substrate so as to sandwich the dot elements therebetween;

a stepped portion having a level difference, said portion being formed in a part of the principal surface of the semiconductor substrate;

a gate insulating film formed so as to overlap the stepped portion; and dot elements formed out of semiconductor or conductor fine particles on the tunnel insulating film and functioning as a floating gate, said dot elements being formed to be self aligned with a part of the gate insulating film on a side face of the stepped portion.

11. The semiconductor device of claim 10, wherein the substrate is a silicon substrate, the principal surface of which is {111} plane, and the side face of the stepped portion is a {100} plane.

* * * * *